(12) United States Patent
Kimura et al.

(10) Patent No.: US 6,746,197 B2
(45) Date of Patent: Jun. 8, 2004

(54) SUBSTRATE PROCESSING APPARATUS AND SUBSTRATE PROCESSING METHOD

(75) Inventors: Yoshio Kimura, Kumamoto-ken (JP); Issei Ueda, Kumamoto-ken (JP); Mitiaki Matsushita, Kumamoto-ken (JP); Kazuhiko Ito, Kumamoto-ken (JP)

(73) Assignee: Tokyo Electron Limited, Tokyo (JP)

(*) Notice: Subject to any disclaimer, the term of this patent is extended or adjusted under 35 U.S.C. 154(b) by 0 days.

(21) Appl. No.: 10/202,090

(22) Filed: Jul. 25, 2002

(65) Prior Publication Data

US 2002/0182040 A1 Dec. 5, 2002

Related U.S. Application Data

(63) Continuation of application No. 09/401,486, filed on Sep. 22, 1999, now Pat. No. 6,439,822.

(30) Foreign Application Priority Data

Sep. 22, 1998 (JP) .......................................... 10-286062
Oct. 13, 1998 (JP) .......................................... 10-291090
Oct. 29, 1998 (JP) .......................................... 10-324532

(51) Int. Cl.$^7$ ............................................. B65G 49/07
(52) U.S. Cl. .................... 414/217; 414/939; 414/940
(58) Field of Search ................................ 414/217, 939, 414/940

(56) References Cited

U.S. PATENT DOCUMENTS

| 4,886,412 | A | | 12/1989 | Wooding et al. |
|---|---|---|---|---|
| 5,048,164 | A | | 9/1991 | Harima |
| 5,388,944 | A | * | 2/1995 | Takanabe et al. ............ 414/217 |
| 5,407,350 | A | * | 4/1995 | Iwabuchi et al. ............ 434/241 |
| 5,562,383 | A | | 10/1996 | Iwai et al. |
| 5,603,777 | A | | 2/1997 | Ohasi |
| 5,628,604 | A | | 5/1997 | Murata et al. |
| 5,685,684 | A | | 11/1997 | Kato et al. |
| 5,810,538 | A | * | 9/1998 | Ozawa et al. ............... 414/217 |
| 5,915,910 | A | * | 6/1999 | Howells et al. ........ 414/937 R |
| 6,019,563 | A | | 2/2000 | Murata et al. |
| 6,102,647 | A | | 8/2000 | Yap |
| 6,183,186 | B1 | | 2/2001 | Howells et al. |
| 6,318,944 | B1 | * | 11/2001 | Shimeno et al. ............. 414/172 |

FOREIGN PATENT DOCUMENTS

| JP | 06-255707 | | 9/1994 |
|---|---|---|---|
| JP | 06-286811 | | 11/1994 |
| JP | 758047 | * | 3/1995 |
| JP | 07-142308 | | 6/1995 |
| JP | 10-256346 | | 9/1998 |

OTHER PUBLICATIONS

Japanese Office Action for JP 10–286062 dated Jun. 4, 2002.
Japanese Office Action for JP 10–324532 dated Jan. 21, 2003.

* cited by examiner

Primary Examiner—Steven A. Bratlie
(74) Attorney, Agent, or Firm—Rader, Fishman & Grauer PLLC

(57) ABSTRACT

A substrate processing apparatus comprises a processing section for performing processing for a substrate, a substrate carrier transfer section into/out of which a substrate carrier holding a plurality of substrates is carried, and a substrate transfer mechanism for taking an unprocessed substrate out of the substrate carrier carried into the substrate carrier transfer section to deliver it to the processing section and for receiving a processed substrate from the processing section to deliver it into the substrate carrier placed on the substrate carrier transfer section. The substrate carrier transfer section shifts the position of the substrate carrier between a first position at which the substrate carrier is carried to/from the outside and a second position at which the substrate in the substrate carrier is delivered to/from the substrate transfer mechanism.

6 Claims, 36 Drawing Sheets

(a)

(b)

SUBSTRATE PROCESSING APPARATUS AND SUBSTRATE PROCESSING METHOD

This application is a continuation of Ser. No. 09/401,486, filed on Sep. 22, 1999 now U.S. Pat. No. 6,439,822.

BACKGROUND OF THE INVENTION

1. Field of the Invention

The present invention relates to a substrate processing method and a substrate processing apparatus for performing exposing processing and developing processing for a substrate such as a semiconductor substrate, an LCD substrate, or the like which is coated with a resist solution.

2. Description of the Related Art

In the photolithography technology in the fabrication process of a semiconductor device, a resist is coated on the surface of a semiconductor wafer (hereinafter referred to as a wafer), the coated resist is exposed to a predetermined pattern and developed, and thus a predetermined pattern of resist film is formed. A series of processing described above is performed by an apparatus in which an aligner is connected to a coating and developing system.

A substrate carrier C housing 25 substrates, for example, semiconductor wafers are placed on a stage which is a substrate carrier transfer section by an automatic transfer robot. A wafer is then taken out of the carrier C by a delivery arm, delivered to a main transfer arm of the coating and developing system, and coated with a resist. Thereafter, the wafer is transferred to the aligner via an interface section to be exposed, and then returned to the coating and developing system to be developed. The wafer which has completed a series of processing is returned into the original carrier C by a route reverse to the one used when being transferred into the system. The carrier C into which all the wafers are returned after completing processing is transferred to a next system or a carrier stocker by the automatic transfer robot.

Incidentally, the fabrication process of a semiconductor device is performed in a clean room in order to prevent adhesion of particles. But, the clean room is expensive, so that it is required to lay out processing apparatus efficiently. In the aforesaid prior art, however, there are some disadvantages that a moving space for the automatic transfer robot which takes charge of transfer of substrates between apparatus needs to be provided in the clean room, and that a wafer or a glass substrate for a liquid crystal display (LCD) is recently increasing in size, thus causing an increase in its moving space, which makes it difficult to realize efficient layout.

SUMMARY OF THE INVENTION

The present invention is made in view of the aforesaid disadvantages, and its object is to provide an apparatus of which the occupation space of the entire system including a substrate carrier transfer mechanism corresponding to an automatic transfer robot is small, thereby efficiently utilizing a space in a clean room.

Another object of the present invention is to provide an apparatus capable of easily controlling the delivery of a substrate carrier between the substrate carrier transfer mechanism and a substrate carrier transfer section.

To attain these objects, a substrate processing apparatus of the present invention comprises a processing section for performing processing for a substrate, a substrate carrier transfer section into/out of which a substrate carrier holding a plurality of substrates is carried, and a substrate transfer mechanism for taking an unprocessed substrate out of the substrate carrier carried into the substrate carrier transfer section to deliver it to the processing section, and for receiving a processed substrate from the processing section to deliver it into a substrate carrier mounted on the substrate carrier transfer section, the substrate carrier transfer section including means for moving the position of the substrate carrier between a first position at which the substrate carrier is carried to/from the outside and a second position at which a substrate in the substrate carrier is delivered to/from said substrate transfer mechanism.

According to the aforesaid invention, even if the timing at which the substrate carrier transfer mechanism reaches the substrate carrier transfer section and the timing at which all substrates in the substrate carrier complete processing and are returned to the substrate carrier are not concurrent, for example, the substrate carrier and the substrates can be delivered smoothly, thus obtaining high throughput.

Further, a substrate processing apparatus of the present invention comprises a substrate carrier transfer section, into/out of which a substrate carrier holding a plurality of substrates is carried, including cooling means, and a processing section for applying a resist onto an unprocessed substrate delivered from a substrate carrier carried into the substrate carrier transfer section.

According to the aforesaid configuration, a substrate can be previously cooled prior to a cooling process of the substrate which is performed before resist coating, thereby reducing substrate processing time. Moreover, cooling processing before resist coating is performed by the cooling means of the substrate carrier transfer section, which makes it possible to remove the configuration of a cooling unit where cooling processing before resist coating is performed from the processing section, whereby an reduction in size of the apparatus is realized.

Furthermore, a substrate processing method of the present invention comprises the steps of carrying a substrate carrier holding a plurality of unprocessed substrates from the outside into a first position of a substrate carrier transfer section, interchanging positions of substrate carriers between the substrate carrier placed in the first position, and a substrate carrier holding processed substrates and placed in a second position of the substrate carrier transfer section, taking the unprocessed substrate out of the substrate carrier moved to the second position to transfer it to a processing section, subsequently processing the substrate in the processing section, returning the substrate processed in the processing section into the substrate carrier placed in the second position, thereafter interchanging positions of substrate carriers between the substrate carrier placed in the second position and a substrate carrier holding unprocessed substrates and placed in the first position, and carrying the substrate carrier placed in the first position out to the outside.

According to the aforesaid configuration, even if the timing at which the substrate carrier transfer mechanism reaches the substrate carrier transfer section and the timing at which all substrates in the substrate carrier complete processing and are returned to the substrate carrier are not concurrent, for example, the substrate carrier and the substrates can be delivered smoothly, thus obtaining high throughput.

These objects and still other objects and advantages of the present invention will become apparent upon reading the following specification when taken in conjunction with the accompanying drawings.

BRIEF DESCRIPTION OF THE DRAWINGS

FIG. 30(a), FIG. 30(b), FIG. 30(c), and FIG. 30 (d) are views related to the ninth embodiment of the present invention, showing states in which the positions of the substrate carriers are moved;

DETAILED DESCRIPTION OF THE PREFERRED EMBODIMENT

Figure 1:
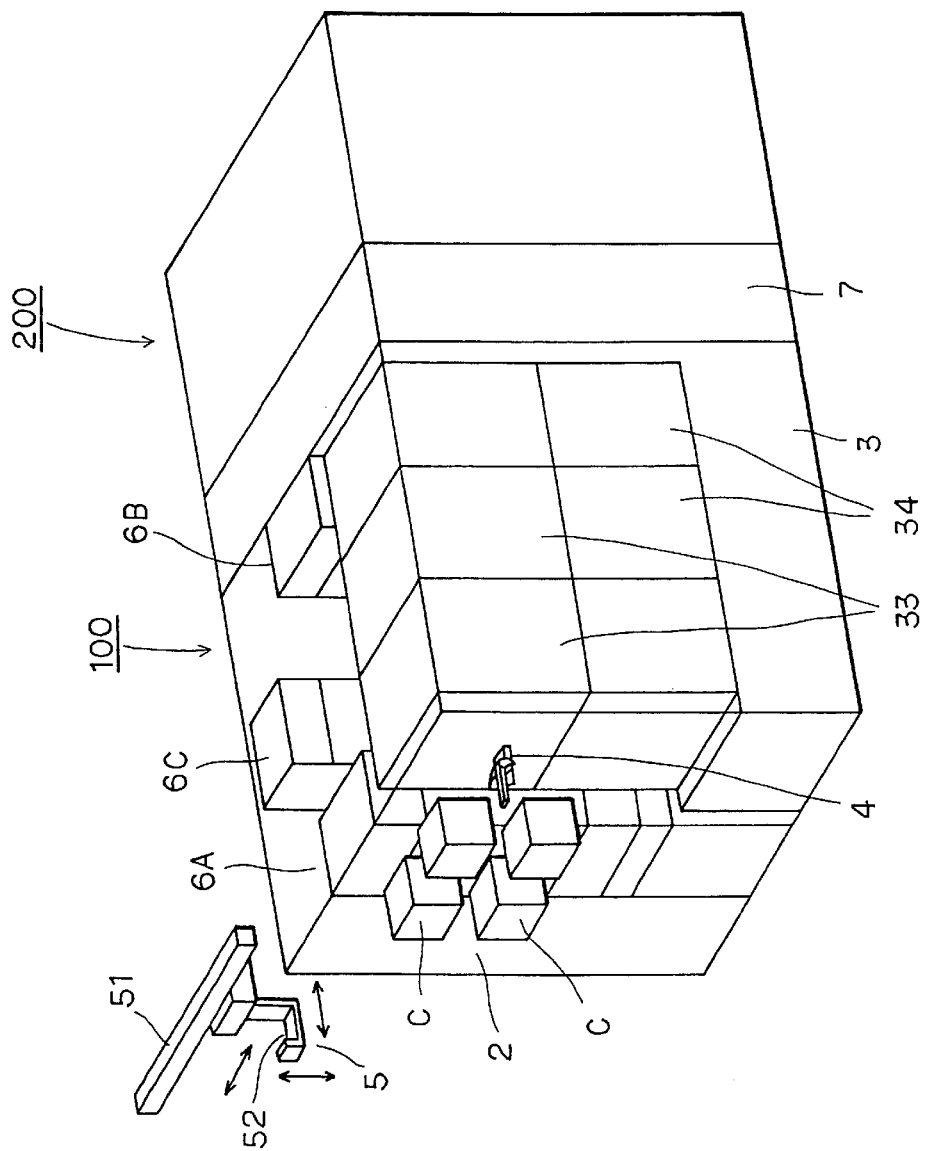
FIG. 1 is a perspective view of a substrate processing apparatus according to a first embodiment of the present invention.
Figure 2:
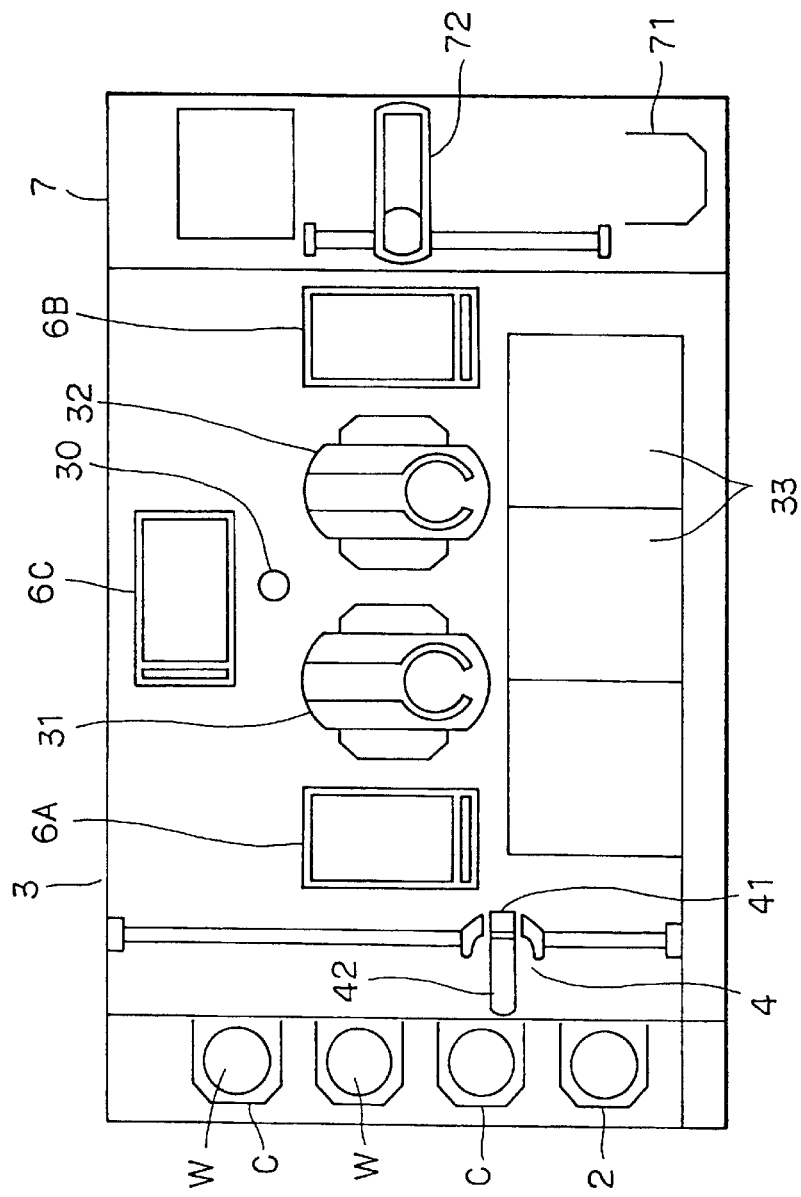
FIG. 2 is a plane view of a coating and developing system according to the first embodiment of the present invention.

A first embodiment in which the present invention is applied to a coating and developing system for coating a wafer which is a substrate with a resist and developing the exposed resist will be described below. FIG. 1 is a schematic view showing a state in which an aligner 200 is connected to a coating and developing system 100. FIG. 2 is a plane view showing the coating and developing system 100.

The coating and developing system 100 includes a substrate carrier transfer section 2 into/out of which a wafer substrate carrier (referred to simply as a substrate carrier hereinafter) C which is a substrate carrier holding a plurality of, for example, 25 semiconductor wafers W (referred to as wafers W hereinafter) in the form of shelves is carried, a processing section 3 for performing coating and developing processing for the wafer W, and a wafer transfer mechanism 4 which is a substrate transfer mechanism for delivering the wafer W between the processing section 3 and the substrate carrier C placed on the substrate carrier transfer section 2. As for the substrate carrier transfer section 2, however, in FIG. 1 and FIG. 2, the illustration of a mechanism portion thereof is omitted for convenience, and a position of the mechanism portion is denoted by a numeral "2".

Figure 3:
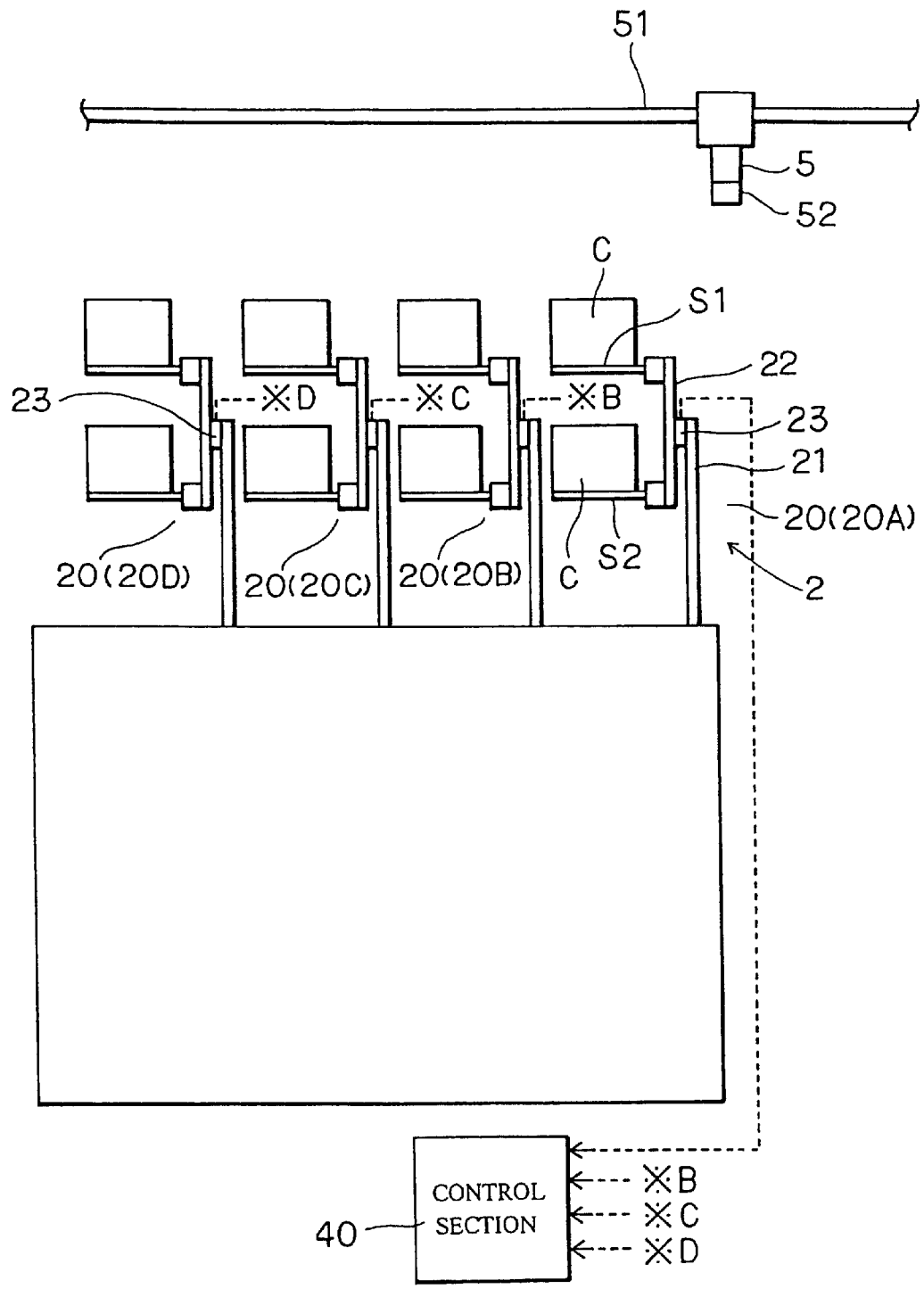
FIG. 3 is a front view of a substrate carrier transfer section of the coating and developing system according to the first embodiment of the present invention for explaining a substrate carrier transfer mechanism.

In the substrate carrier transfer section 2, two substrate carriers C as a pair are vertically mounted and four interchange mechanisms 20 (20A to 20D) for interchanging the upper and lower positions of the two substrate carriers C are laterally arranged as shown in FIG. 3. It should be noted that in the coating and developing system 100, the substrate carrier transfer section 2 is regarded as located at the front, and the positions of the right, left, front, and rear are based on this direction when the processing section 3 is seen from the substrate carrier transfer section 2.

Figure 4:
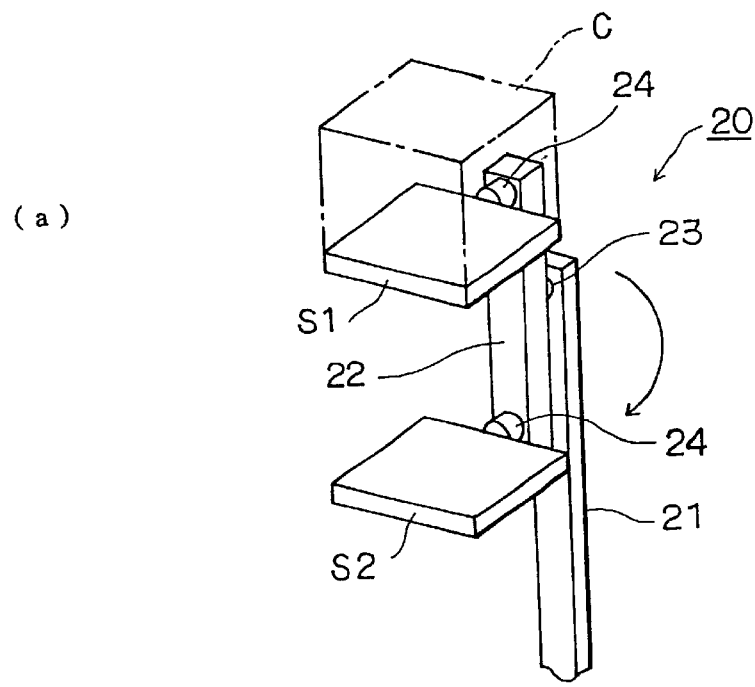
FIG. 4(a) and FIG. 4(b) are perspective views showing means for moving a substrate carrier according to the first embodiment of the present invention.
Figure 4:
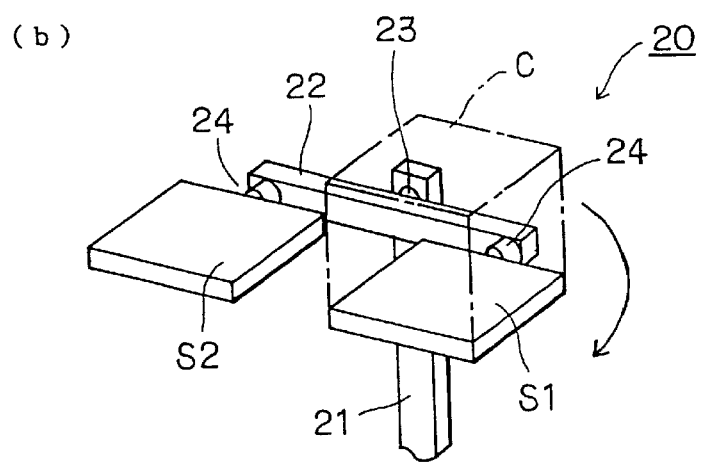

As shown in FIG. 3 and FIG. 4, the interchange mechanism 20 has a configuration in which a rotating arm 22 which is a rotating member rotating forward and backward around an almost horizontal axis is provided at the upper end of a support rod 21 with a motor 23 between them, and in which a first substrate carrier mounting table S1 and a second substrate carrier mounting table S2 are provided respectively at both ends of the rotating arm 22 with attitude control mechanisms 24 between them. The first and second substrate mounting tables S1 and S2 respectively correspond to a first mounting section and a second mounting section of the present invention, and are provided with, for example, guide members for positioning the bottom portions of substrate carriers C and the like although not illustrated.

The attitude control mechanisms 24 are provided for keeping the substrate carrier mounting tables S1 and S2 nearly horizontal even if the rotating arm 22 is in any rotational position. For example, the attitude mechanism 24 can be structured so that a motor is attached to the rotating arm 22 and the substrate carrier mounting table S1 (S2) is secured to the drive shaft of the motor to control the rotation angle of the motor in accordance with the rotation angle of the rotating arm 22.

In the respective interchange mechanisms 20 (20A to 20D), the motors 23 are controlled by a control section 40, and each of the rotating arms 22 is stopped in a vertical position. For instance, when the substrate carrier C holding wafers to be processed is placed on one of the mounting tables S1 and S2 from a substrate carrier transfer mechanism described later and a predetermined number of processed wafers are returned into the substrate carrier C placed on the other of the mounting tables S1 and S2, a control signal is sent from the control section 40 to the corresponding motor 23. As a result, the rotating arm 22 is rotated 180° to thereby interchange the upper and lower positions of the mounting tables S1 and S2.

Figure 5:
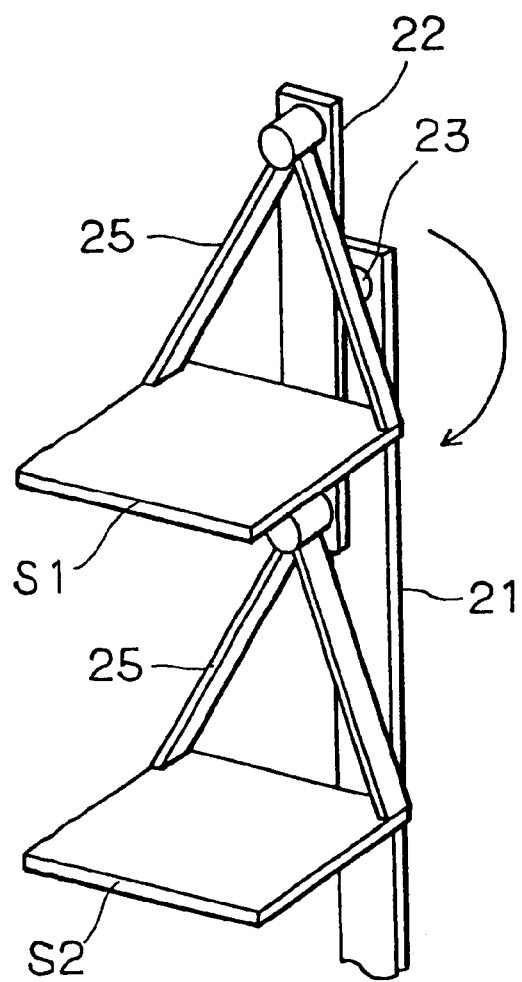
FIG. 5 is a perspective view of another means for moving the substrate carrier.

Although the explanation is given in this embodiment on the assumption that the aforesaid interchange mechanism 20 is used, the interchange mechanism 20 is not limited to the aforesaid structure. For instance, as shown in FIG. 5, it may be structured so that hanging members 25 and 25 are pivotally supported at both ends of the rotating arm 22, and that the substrate carrier mounting tables S1 and S2 are respectively provided at the lower ends of the hanging members 25 and 25 and rotated in nearly horizontal positions just like a Ferris wheel. Moreover, in the substrate carrier transfer section 2, a substrate carrier called a carrier for pickup use or the like for housing dummy wafers or the like may be placed, in which case, for instance, a dedicated mounting table may be provided adjacent to a row of four interchange mechanisms 20 and the aforesaid substrate carrier can be mounted on this mounting table.

Figure 6:
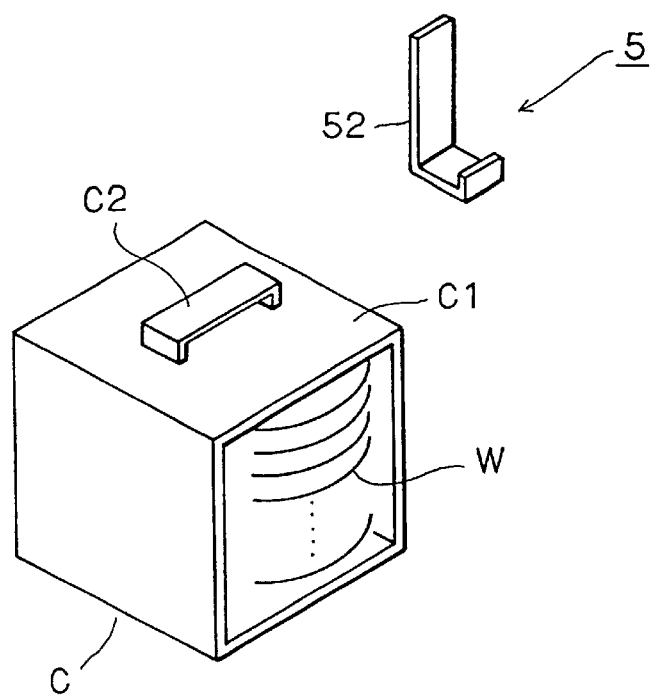
FIG. 6 is a perspective view of the substrate carrier.
Figure 6:
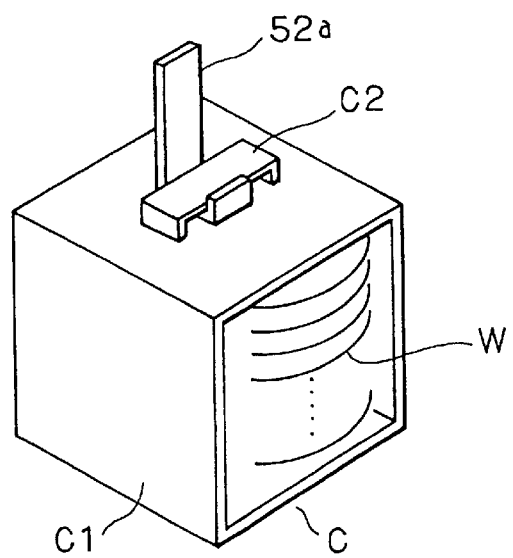

A substrate carrier transfer mechanism 5 is provided above the coating and developing system 100, for example, in the vicinity of the ceiling of a clean room. The substrate carrier transfer mechanism 5 is movable while guided by a guide member 51 extending in a lateral direction, for instance, almost horizontally. Before explaining the substrate carrier transfer mechanism 5, the structure of the substrate carrier C is described based on FIG. 6. The substrate carrier C in this embodiment has a structure in which the front face thereof is open and a U-shaped handle C2 in front view is attached on a case C1 provided with slots for holding the peripheries of wafers W. The substrate carrier transfer mechanism 5 has a hanging member 52 passing under the handle C2 of the substrate carrier C to engage with the handle C2. The hanging member 52 is movable back and forth, and up and down, and delivers the substrate carrier C to the mounting table S1 (S2) located at the upper side out of the mounting tables S1 and S2. Incidentally, the substrate carrier transfer mechanism 5 is not limited to the structure in which the substrate carrier C is hung. The substrate carrier transfer mechanism 5 may have a structure in which the substrate carrier C is held by the side faces thereof with a pair of opening and closing arms.

Returning to FIG. 1 and FIG. 2, the wafer transfer mechanism 4 will be described. In the wafer transfer mechanism 4, an arm 42 movable back and forth is attached to a transfer base 41 which is movable vertically and laterally. The wafer transfer mechanism 4 sends and receives the wafer W to/from the substrate carrier C on the mounting table S2 (S1) located on the lower side out of the mounting tables S1 and S2 and to/from a delivery unit described later in the processing section 3.

Figure 7:
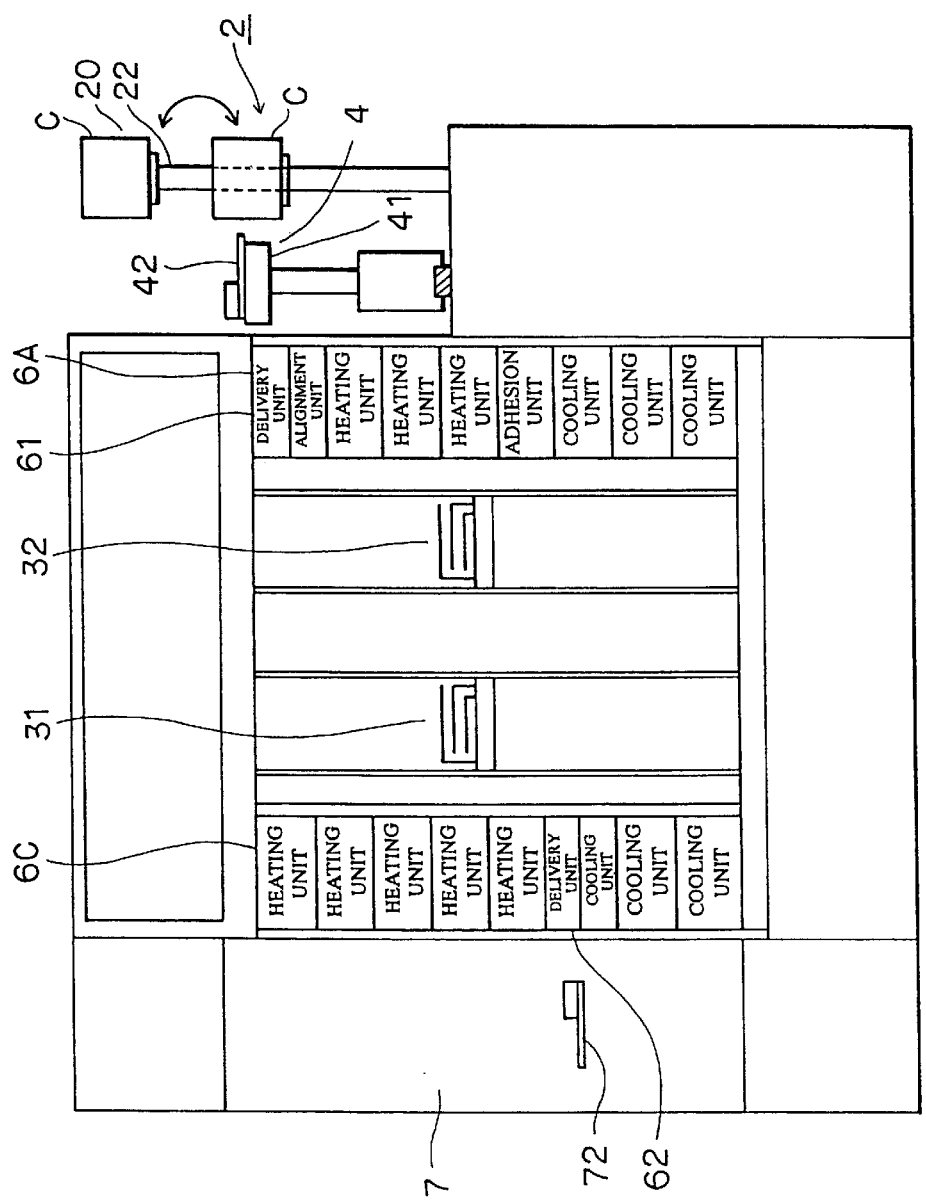
FIG. 7 is a rear view of the coating and developing system according to the first embodiment of the present invention.

The processing section 3 includes two main transfer arms 31 and 32 at the center thereof, and shelves 6A, 6B and 6C are respectively provided in front of, behind, and on the left side of the main transfer arms 31 and 32. The shelves 6A to 6C are each composed of a plurality of units piled on top of one another. As shown in FIG. 7, these units are allocated for a heating unit for heating a wafer, a cooling unit for cooling the wafer, a hydrophobic processing unit for making the surface of the wafer hydrophobic, an alignment unit for aligning the wafer, and the like. Further, in each of the shelves 6A and 6C, one unit of a unit group is allocated for a delivery unit of the wafer. In FIG. 7, numerals 61 and 62 represent deliver units. It should be noted that the allocation of the units shown in FIG. 7 is performed for convenience to give an image, and that the arrangement of the units is not restricted to the above one. A detailed operation mechanism in the processing section 3 will be explained in a second embodiment described later.

On the right side of the main transfer arms 31 and 32, three developing units 33 composing a developing processing section are provided on the upper tier side and three coating units 34 composing a coating processing section on the lower tier side. The main transfer arms 31 and 32 are ascendable and descendable, rotatable around a vertical axis, and movable forward and backward, and assigned to deliver the wafer W between the respective units of the shelves 6A to 6C, the coating units 34, and the developing units 33. Incidentally, the delivery of the wafer W between the main transfer arms 31 and 32 is performed via an ascendable and descendable intermediate stage 30.

The coating and developing system 100 includes an interface section 7, and the processing section 3 is connected to the aligner 200 (See FIG. 1.) with the interface section 7 between them. The interface section 7 is used for preventing the wafer W from staying due to difference in processing speed between the coating and developing system 100 and the aligner 200, and includes a transfer arm 72 for transferring the wafer W between the delivery unit 62, an inlet/outlet port of the aligner 200, and a buffer carrier 71.

Next, the operation of the aforesaid embodiment will be described. First, the substrate carrier C carried while hung in the vicinity of the ceiling of the clean room by the substrate carrier transfer mechanism 5 is placed on the mounting table S1 (S2) located on the upper tier side which is a first position of the substrate carrier transfer section 2. The rotating arm 22 of the interchange mechanism 20 is then rotated 180° to thereby change the vertical placement of the mounting table S1 (S2), so that the substrate carrier C moves to the lower tier side which is a second position. Subsequently, the unprocessed wafer W is taken out of the substrate carrier C by the wafer transfer mechanism 4 to be delivered to the delivery unit 61 (See FIG. 7.) of the processing section 3. The wafer W is transferred to processing units of the shelves 6A or 6C sequentially by means of the main transfer arm 31 and undergoes predetermined processing, for example, hydrophobic processing, cooling processing or the like. Then, after being coated with a resist in the coating unit 34 and heat-treated, the wafer W is carried from the delivery unit 62 to the aligner 200 (See FIG. 1.) via the interface section 7.

The wafer W exposed in the aligner 200 is returned to the processing section 3 by a route reverse to the above and transferred to the developing unit 33 by the main transfer arm 32 to be developed. Specifically, the wafer W undergoes heating and cooling processing before developing processing. The developed wafer W is returned into the original substrate carrier C on the mounting table S1 (S2) of the substrate carrier transfer section 2 by a route reverse to the above.

Meanwhile, on the mounting table S2 (S1) on the upper tier side, the next substrate carrier C is mounted by the substrate carrier transfer mechanism 5 by this point in time. After all the wafers W in the substrate carrier C on the mounting table S1 (S2) on the lower tier side complete processing and are returned into the above substrate carrier C, the rotating arm 22 of the interchange mechanism 20 is rotated in accordance with a control signal from the control section 40 to thereby interchange the upper and lower positions of the mounting tables S1 and S2. The substrate carrier C moved to the upper tier side is transferred to the next processing station or a stocker by the substrate carrier transfer mechanism 5. Incidentally, the operation in which the substrate carrier transfer mechanism 5 places the substrate carrier C housing the unprocessed wafers W on the substrate carrier transfer section 2 and carries another substrate carrier C housing the processed wafers W, is given as an example in this explanation. In some cases, however, the substrate carrier transfer mechanism 5 only receives the substrate carrier C from the substrate carrier transfer section 2 or only delivers the substrate carrier C to the substrate carrier transfer section 2.

According to the aforesaid first embodiment, the interchange mechanism 20 in which the two mounting tables S1 and S2 rotate is provided in the substrate carrier transfer section 2 so as to interchange positions of the substrate carriers C between the first position on the upper tier side where the substrate carrier C is sent and received to/from the substrate carrier transfer mechanism 5 and the second position where the wafer W is sent and received to/from the wafer transfer mechanism 4. Accordingly, even if the processing for the wafers W in the substrate carrier C previously placed has not completed when the substrate carrier transfer mechanism 5 reaches the substrate carrier transfer section 2 in order to place the substrate carrier C housing the unprocessed wafers W, for example, the substrate carrier C can be delivered onto the mounting table S1 (S2) at the first position if it is vacant. If the next substrate carrier C is placed in the first position when the processing for all the wafers W in the substrate carrier C placed in the second position is completed, the wafer transfer mechanism 4 can get access to the wafer W in the next substrate carrier C by interchanging the positions of the mounting tables S1 and S2. Thus, the substrate carrier and the wafer W are smoothly delivered in the substrate carrier transfer section 2, thereby obtaining high throughput.

Further, since the substrate carrier transfer mechanism runs at a high location distant from the floor, the area of the floor hitherto used for a traveling path of the substrate carrier transfer mechanism can be utilized for an installation space of apparatus, for example, thus enabling an efficient layout in an expensive clean room. In this case, if the mounting tables S1 and S2 are set in a vertical placement and the substrate carrier transfer mechanism 5 gets access to the substrate carrier C on the upper tier side, there arises an advantage that the substrate carrier transfer mechanism 5 can be provided in a high location and a stroke thereof in access can be reduced.

Figure 8:
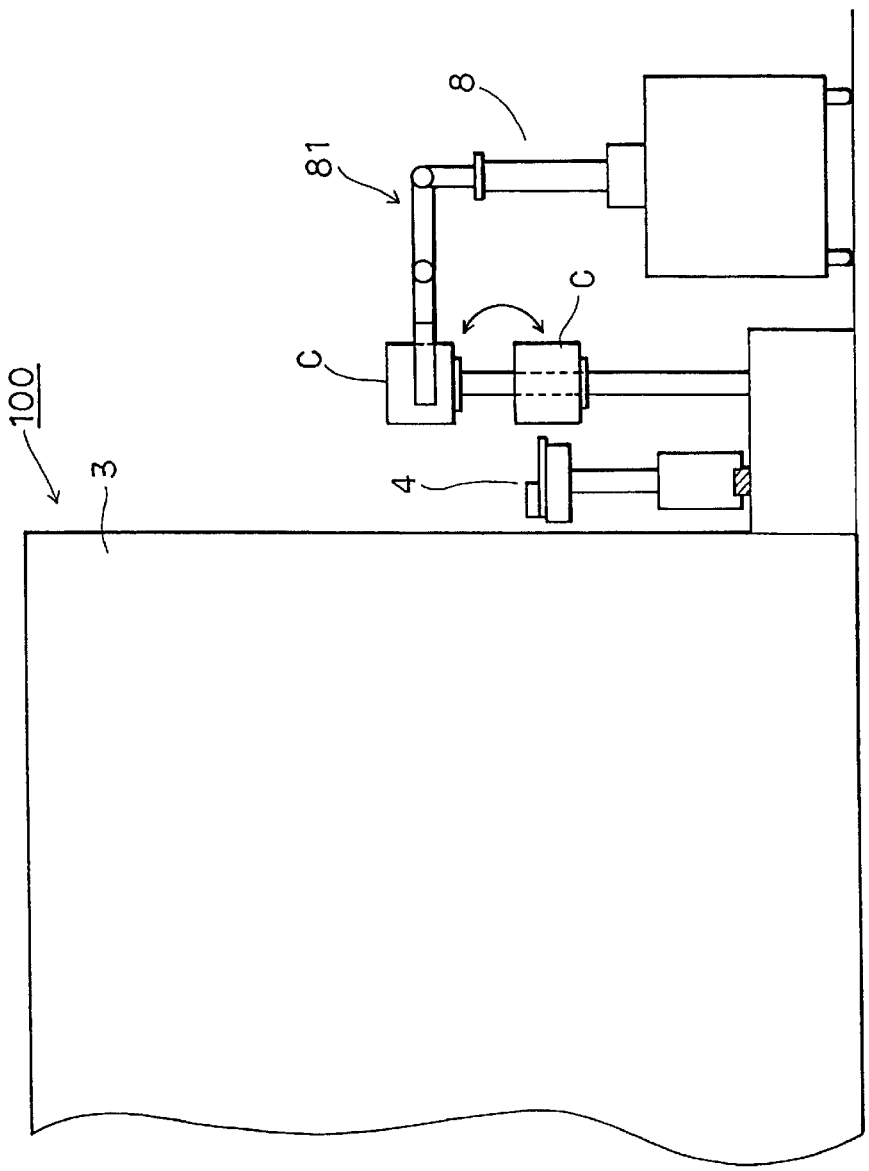
FIG. 8 is a view showing another substrate carrier transfer mechanism.

In the present invention in the above description, an automatic transfer robot 8 which travels along the floor and has an arm 81 for handling the substrate carrier C may be used as the substrate carrier transfer mechanism as shown in FIG. 8. Further, the substrate carrier transfer mechanism may get access to the substrate carrier C or to the wafer W while the mounting tables S1 (S2) are stopped in a placement of one behind the other instead of a vertical placement in the substrate carrier transfer section 2, and the front and rear positions of the substrate carriers C may be interchanged. Furthermore, the substrate carrier C may be carried into the substrate carrier transfer section 2 by an operator.

Next, a second embodiment will be described.

Figure 9:
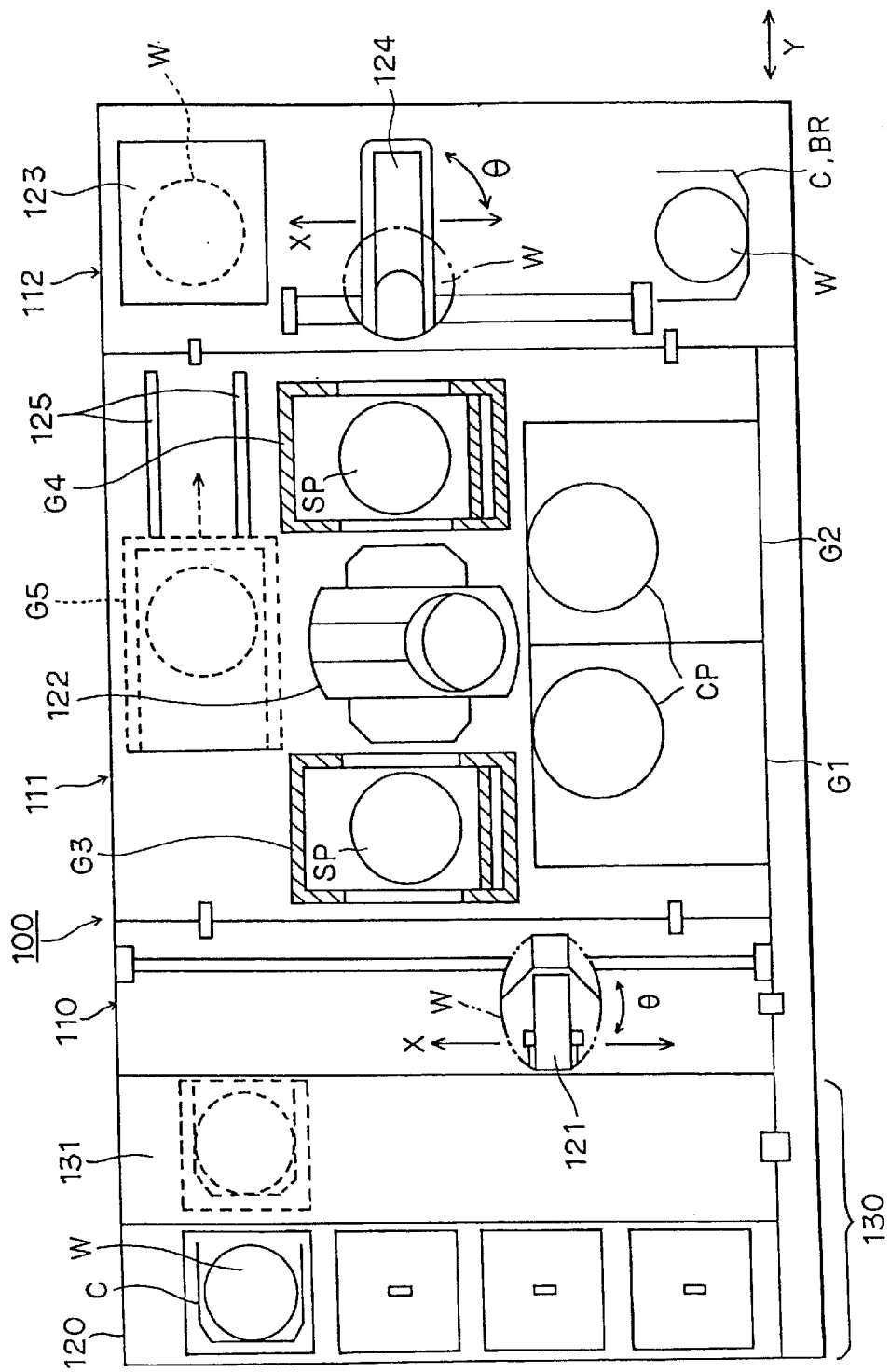
FIG. 9 is a plane view of a coating and developing system according to a second embodiment of the present invention.

FIG. 9 is a plane view showing the coating and developing system 100 of the wafer W according to the second embodiment of the present invention.

In the coating and developing system 100, a wafer transfer mechanism 110 which is a substrate transfer mechanism for carrying a plurality of wafers W as objects to be processed, for example, 25 wafers W per substrate carrier C, as a unit, from/to the outside to/from the system and for carrying the wafer W into/out of the substrate carrier C, a processing section 111 in which various processing units for performing predetermined processing for the wafers W one by one in coating and developing processes are multi-tiered at predetermined positions, and an interface section 112 for transferring the wafer W to/from an aligner (not shown) provided adjacent to the processing section 111, are integrally connected.

In the wafer transfer mechanism 110, a plurality of substrate carriers C are mounted at positions on a carrier mounting table 120 in a line in an X-direction with the respective wafer transfer ports thereof facing to the processing section 111 side. An auxiliary arm 121 movable in the direction of arrangement of the carriers (the X-direction) and in the direction of arrangement of the wafers W housed in the substrate carrier C (a Z-direction; a vertical direction) selectively gets access to each substrate carrier C.

The auxiliary arm 121 is rotatable in a θ-direction and also accessible to an alignment unit (ALIM) and an extension unit (EXT) arranged in a multi-tiered unit section of a third processing unit group $G_3$ on the processing section 111 side as described later.

The processing section 111 is provided with a main arm 122 of a vertically transfer type including a wafer transfer device, around which all the processing units are multi-tiered in one group or plural groups.

Figure 10:
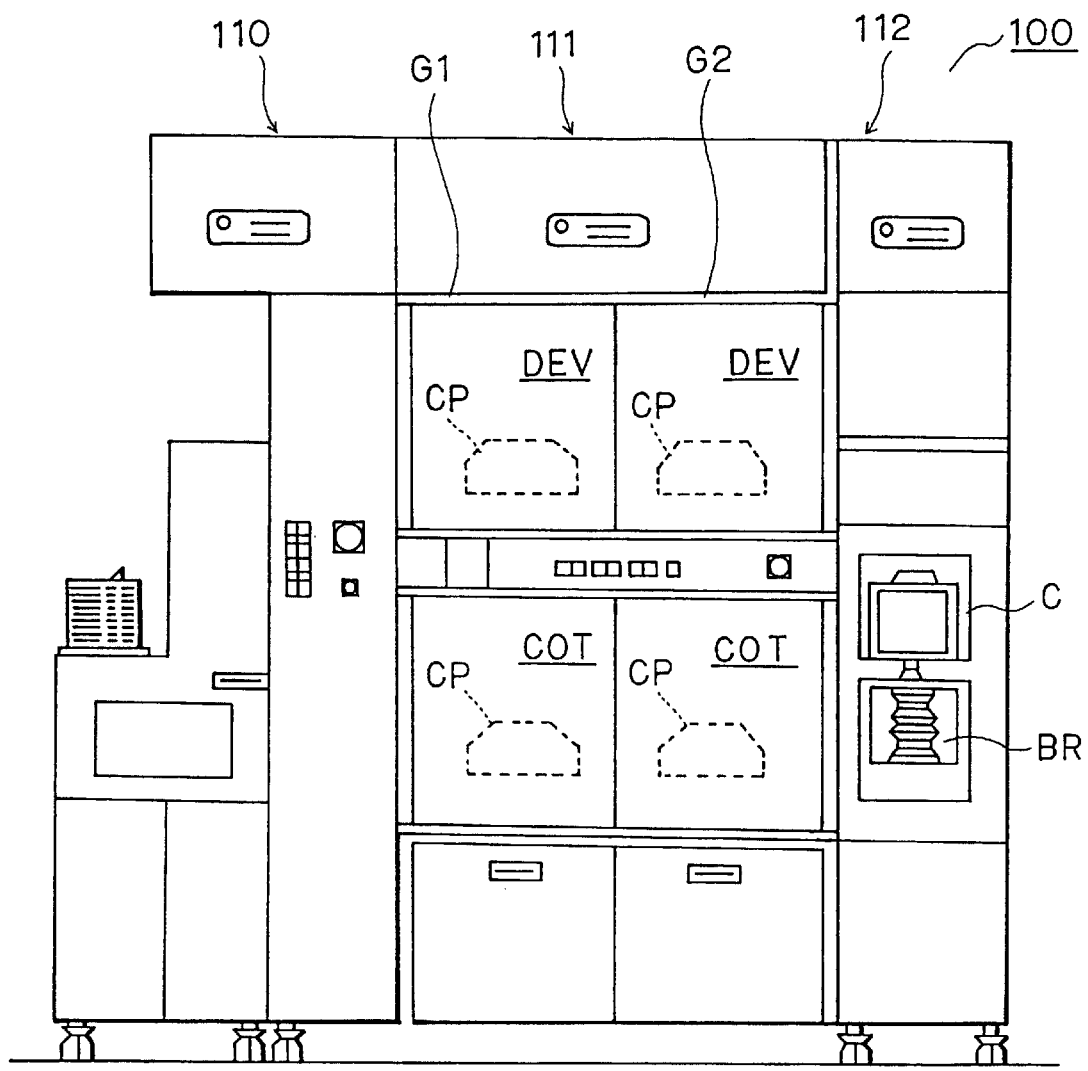
FIG. 10 is a front view of the coating and developing system according to the second embodiment of the present invention.

FIG. 10 is a front view of the aforesaid coating and developing system 100.

In a first processing unit group $G_1$, two spinner type processing units in which the wafer W is put on a spin chuck in a cup CP to undergo predetermined processing, for example, a resist coating unit (COT) and a developing unit (DEV) are two-tiered from the bottom in order. In a second processing unit group $G_2$, two spinner type processing units, for example, a resist coating unit (COT) and a developing unit (DEV) are two-tiered from the bottom in order. It is preferable to arrange these resist coating units (COT) at the lower tier as described above since drainage of a resist solution is troublesome in terms of mechanism and maintenance. However, it is naturally possible to properly arrange them at the upper tier as required.

Figure 11:
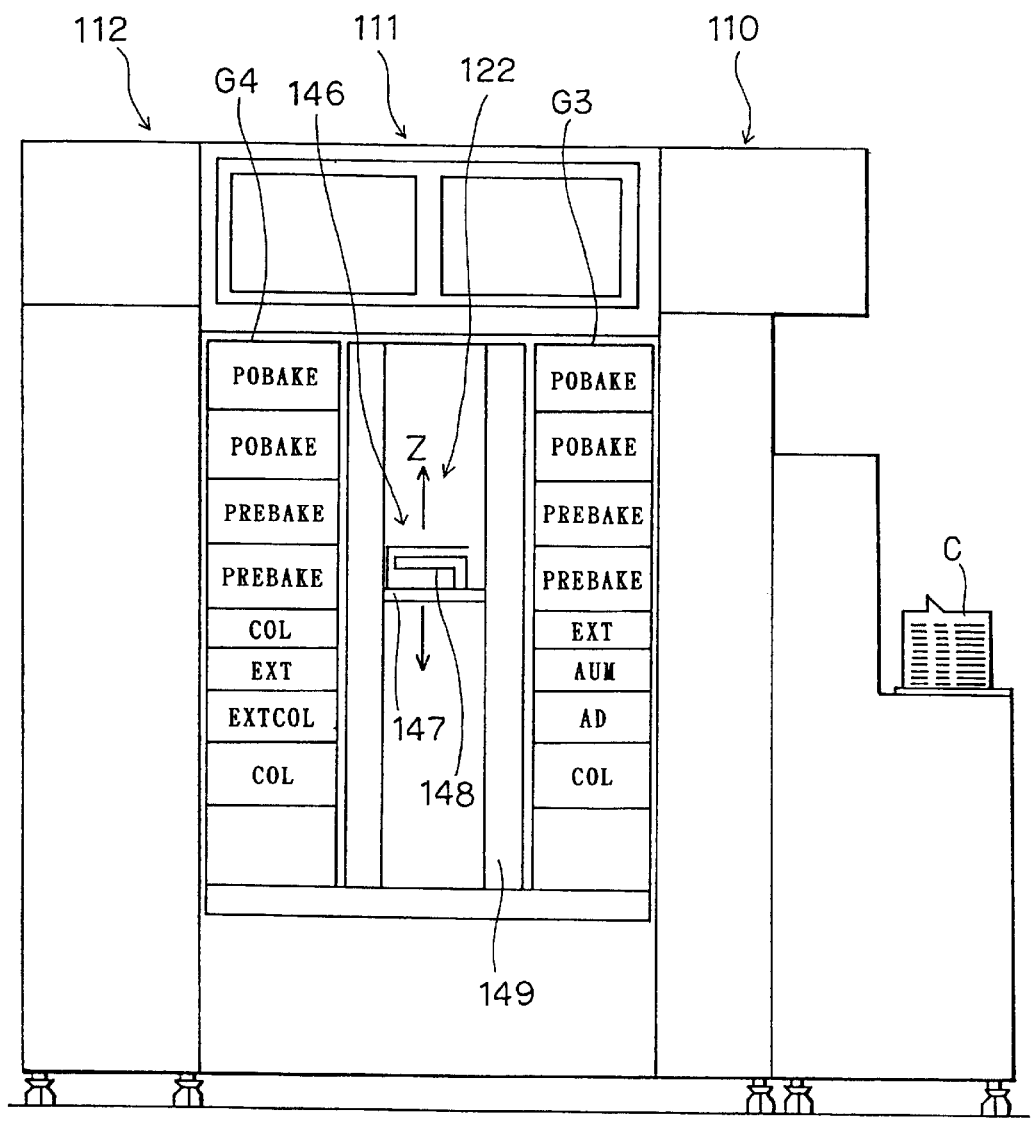
FIG. 11 is a rear view of the coating and developing system according to the second embodiment of the present invention.

FIG. 11 is a rear view of the coating and developing system 100.

In the main transfer mechanism 122, a wafer transfer device 146 is provided to be ascendable and descendable in a vertical direction (the Z-direction) within a cylindrical supporter 149. The cylindrical supporter 149 is connected to a rotating shaft of a motor (not shown) and rotates around the rotating shaft integrally with the wafer transfer device 146 by rotating driving force of the motor. Thereby, the wafer transfer device 146 is rotatable in the θ-direction. Incidentally, the cylindrical supporter 149 may be structured to connect to another rotating shaft (not shown) rotated by the above motor.

Provided in the wafer transfer device 146 are a plurality of holding members 148 movable in the longitudinal direction of a transfer base 147. The holding members 148 permit the delivery of the wafer W between respective processing units.

As shown in FIG. 9, five processing unit groups $G_1$, $G_2$, $G_3$, $G_4$, and $G_5$ can be arranged in the coating and developing system 100. It is possible to arrange the multi-tiered units of the first and second processing unit groups $G_1$ and $G_2$ on the front side of the system (this side of FIG. 9), the multi-tiered units of the third processing unit group $G_3$ adjacent to the wafer transfer mechanism 110, the multi-tiered units of the fourth processing unit group $G_4$ adjacent to the interface section 112, and the multi-tiered units of the fifth processing unit group $G_5$ on the rear side.

As shown in FIG. 11, in the third processing unit group $G_3$, oven-type processing units in which the wafer W is mounted on a holding table (not shown) to undergo predetermined processing, for example, a cooling unit (COL) for cooling processing, an adhesion unit (AD) for performing so-called hydrophobic processing to enhance fixedness of a resist, an alignment unit (ALIM) for alignment, an extension unit (EXT), a prebaking unit (PREBAKE) for thermal processing before exposure, and a postbaking unit (POBAKE) for thermal processing after exposure are, for instance, eight-tiered from the bottom in order. Also in the fourth processing unit group $G_4$, oven-type processing units, for example, a cooling unit (COL), an extension and cooling unit (EXTCOL), an extension unit (EXT), a cooling unit (COL), a prebaking unit (PREBAKE), and a postbaking unit (POBAKE) are, for instance, eight-tiered from the bottom in order.

The arrangement of a cooling unit (COT) and an extension and cooling unit (EXTCOL) having a low processing temperature at the lower tiers and a prebaking unit (PREBAKE), a postbaking unit (POBAKE), and an adhesion unit (AD) having a high processing temperature at the upper tiers, can reduce thermal mutual interference between units. It is natural that random multi-tiered arrangement is possible.

As shown in FIG. 9, the interface section 112 is the same as the processing section 111 in a depth directional (X-directional) dimension but smaller than the processing section 111 in a width directional (Y-directional) dimension. A transportable pickup substrate carrier C' and a fixed buffer carrier BR are two-tiered at the front of the interface section 112, and a peripheral aligner 123 is disposed at the rear thereof, and a wafer transfer body 124 is provided at the center thereof. The wafer transfer body 124 moves in the X-direction and the Z-direction to get access to both the substrate carriers C' and BR and the peripheral aligner 123.

The wafer transfer body 124 is also rotatable in the θ-direction to be accessible to the extension unit (EXT) disposed in the multi-tiered units of the fourth processing unit group $G_4$ on the processing section 111 side and to a wafer delivery table (not shown) on the adjacent aligner side.

In the coating and developing system 100, the multi-tiered units of the fifth processing unit group $G_5$ shown by the broken line in FIG. 9 can be disposed on the rear side of the main wafer transfer mechanism 122 as described above. The multi-tiered units of the fifth processing unit group $G_5$ are movable in the Y-direction along guide rails 125. Accordingly, even when the multi-tiered units of the fifth processing unit group $G_5$ are provided as shown, the multi-tiered units move along the guide rails 125, thereby securing a spatial portion. As a result, the maintenance operation for the main wafer transfer mechanism 122 can be easily carried out from the rear thereof.

Next, a container mounting unit 130 which is a substrate carrier transfer section according to the second embodiment will be explained.

Figure 12:
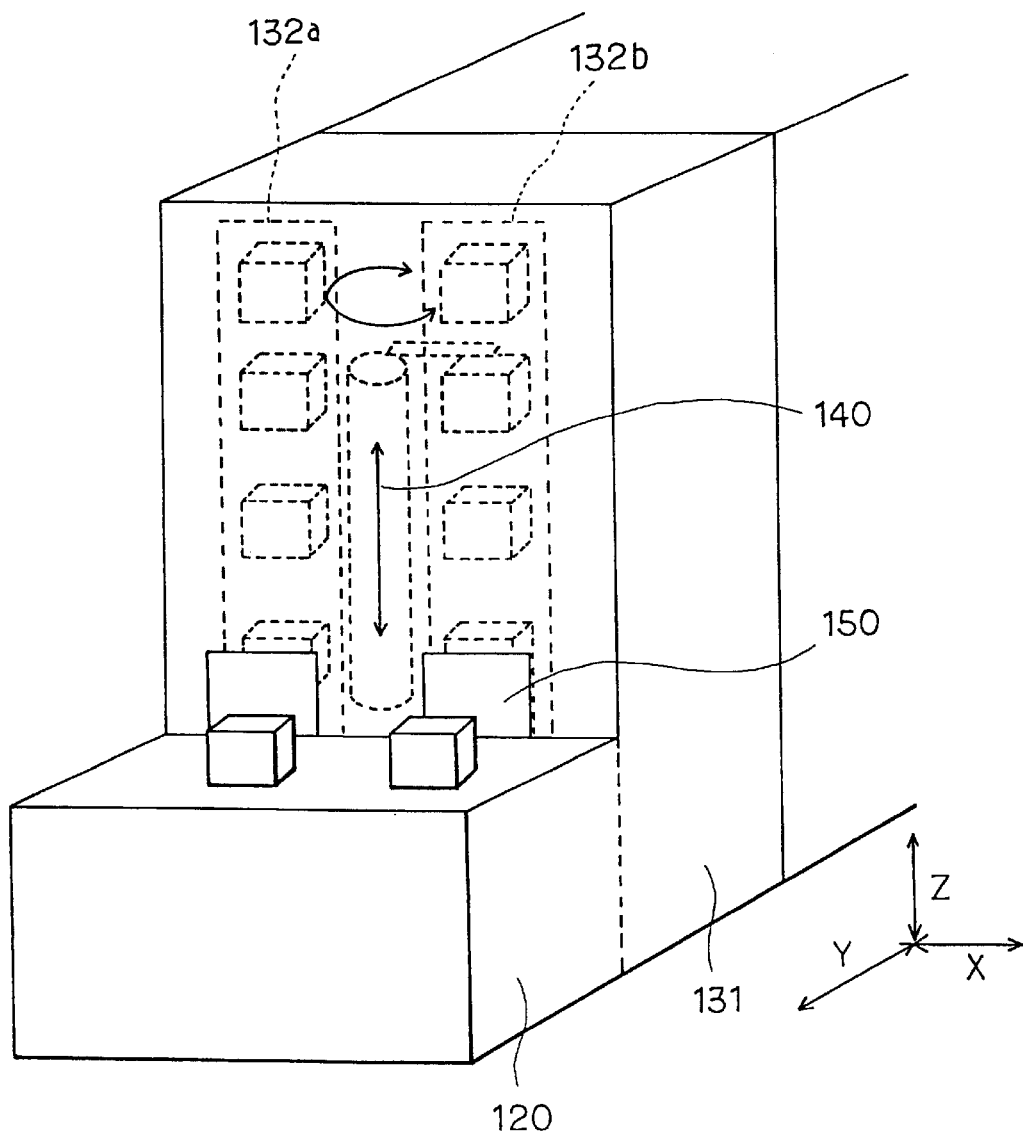
FIG. 12 is a perspective view for explaining means for moving a substrate carrier according to the second invention.
Figure 13:
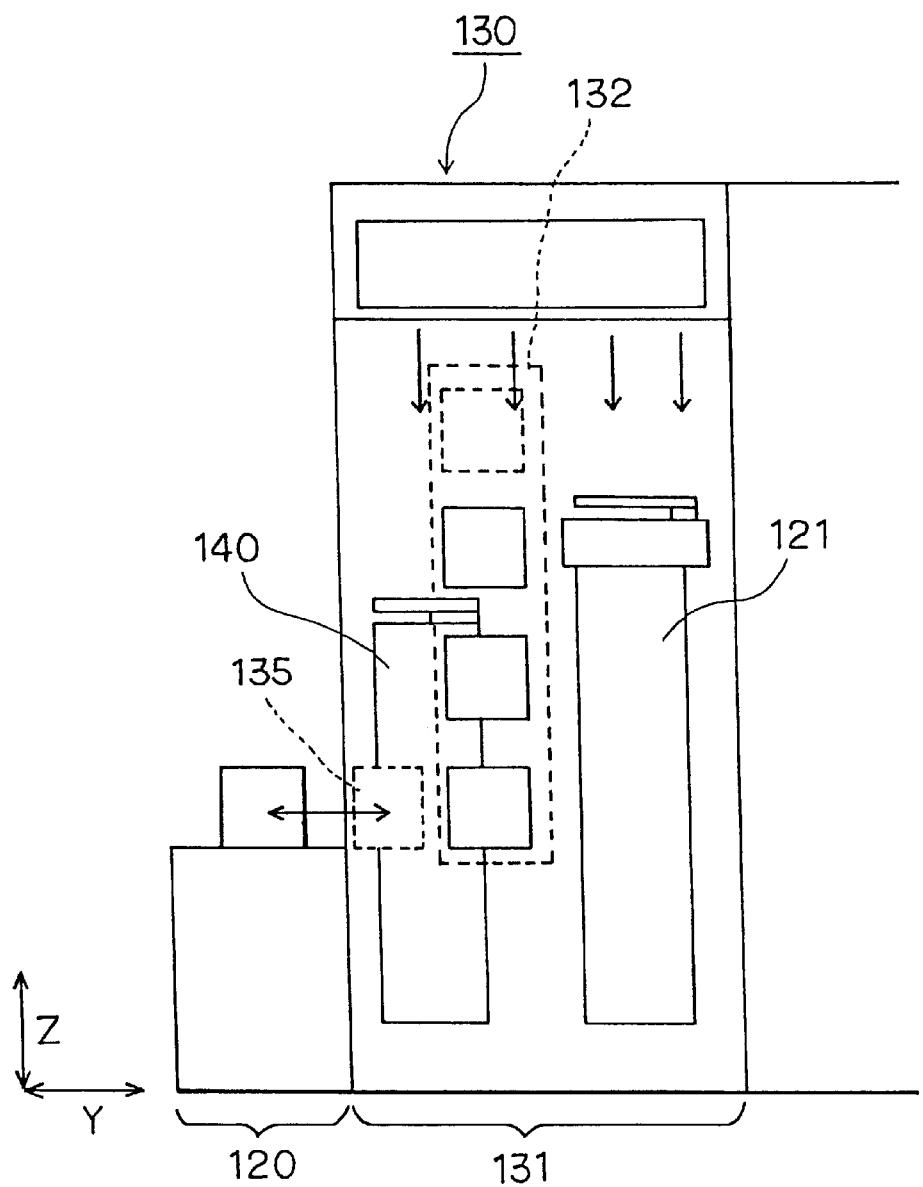
FIG. 13 is a sectional view of FIG. 12.

FIG. 12 is a perspective view of a processing apparatus according to the second embodiment of the present invention seen from diagonally behind of the substrate carrier mounting section 120. FIG. 13 is a vertical sectional view of the container mounting unit 130 of the processing apparatus. Although FIG. 9 shows a state in which four substrate carriers C are mounted on the substrate carrier mounting section, FIG. 12 shows a state in which two substrate carriers C are mounted on the substrate carrier mounting section for explanation. FIG. 9 shows a state in which two of mechanisms in FIG. 12 are placed side by side.

Provided in the processing apparatus according to the second embodiment are the substrate carrier mounting section 120 as a first position, a carrier holding section 132 as a second position, and a waiting position 135 as a third position.

As shown in FIG. 12, the carrier holding section 132 holds at least two substrate carriers C in multiple tiers in a vertical direction. For example, a total of eight substrate carriers C are held in four tiers with two substrate carriers C in each tier in this processing apparatus.

The stroke of the auxiliary arm 121 in the vertical direction corresponds to the height directional dimension of the carrier holding section 132, and the auxiliary arm 121 gets access to all of the eight substrate carriers C held in the carrier holding section 132.

The substrate carrier mounting section 120 is structured to mount the substrate carrier C on a mounting table and thus adaptable to both methods in which the substrate carrier C is moved in a horizontal direction by the automatic transfer robot (AGV) and in which the substrate carrier C is moved while hung from the ceiling (OHT).

The waiting position 135 is disposed between the aforesaid carrier holding section 132 and the substrate carrier mounting section 120, which mitigates the flow of operation when the substrate carrier C is transferred between the carrier holding section 132 and the substrate carrier mounting section 120.

As shown in FIG. 12 and FIG. 13, a carrier transfer arm 140 is disposed between two substrate carriers C held side by side in the X-direction of the carrier holding section 132 in the processing apparatus according to this embodiment.

The carrier transfer arm 140 is a device for moving the substrate carrier C between the carrier holding section 132 and the waiting position 135 and has such a structure that a wafer holding portion at the forward end of the auxiliary arm 121 is replaced with an arm capable of holding the substrate carrier C.

Figure 14:
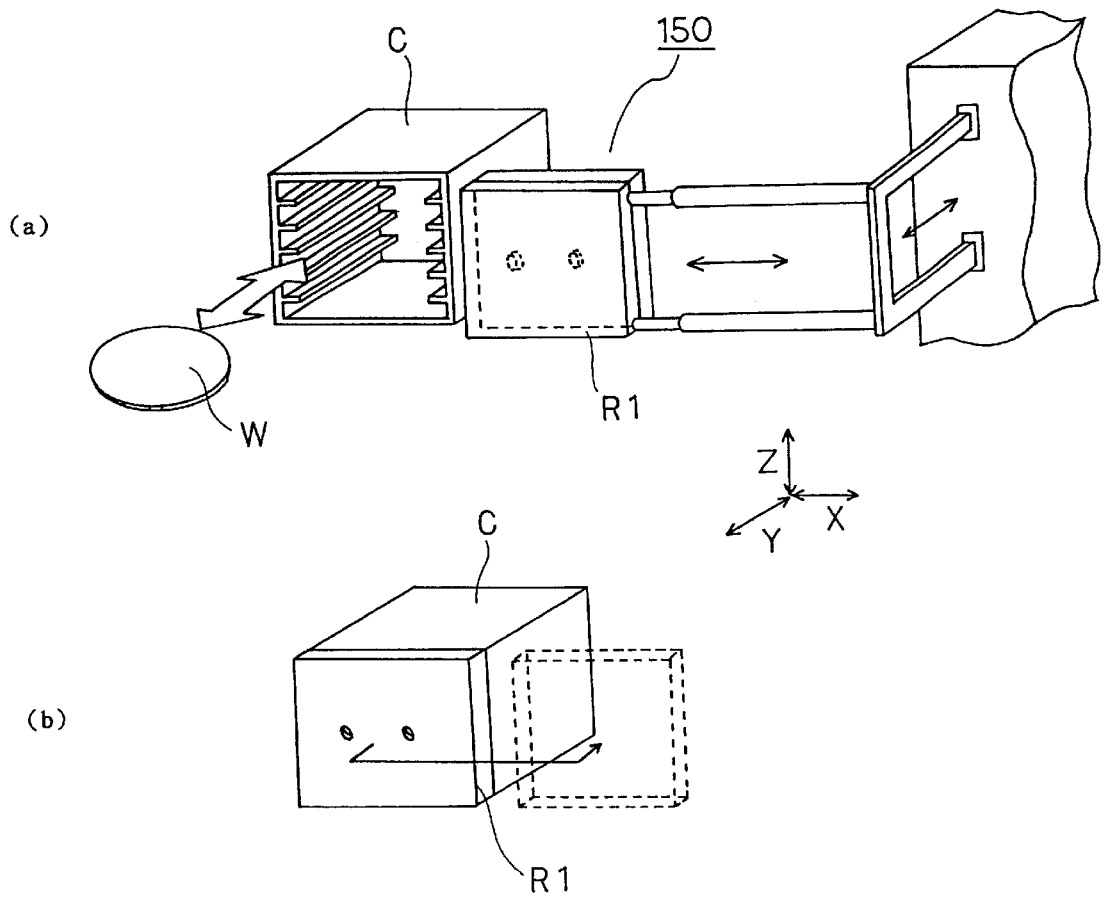
FIG. 14(a) and FIG. 14(b) are perspective views for explaining an operation mechanism of the coating and developing system according to the second embodiment of the present invention.

Moreover, in the processing apparatus, a lid opening and closing device of a horizontal slide type is disposed at a position corresponding to the opening of the substrate carrier C of the carrier holding section 132. FIG. 14(*a*) and FIG. 14(*b*) are enlarged perspective views of an opening and closing portion of a lid opening and closing device 150 of the container mounting unit 130 according to this embodiment.

As shown in FIG. 14(*a*), the lid opening and closing device 150 horizontally slides, in other wards, slides in the Y-direction to open and close a lid R1 of the opening of the substrate carrier C.

Thus, when the lid R1 is opened or closed, the lid R1 moves as shown by the arrow in FIG. 14(*b*).

The reason why the device is of a horizontal slide type is that it is unnecessary to secure a space for storing the lid R1 removed from the substrate carrier C between two container holding sections arranged vertically next to each other, thus raising the container accommodating density in the vertical direction of the carrier holding section 132.

In the processing apparatus according to this embodiment, when the substrate carrier C housing the unprocessed wafers W is mounted on the substrate carrier mounting section 120 by means of an external transfer device such as the automatic transfer robot (AGV), it is carried to the waiting position 135 by a linear drive motor L similar to that in the aforesaid first embodiment while moving in the Y-direction. Thereafter, the carrier transfer arm 140 holds the substrate carrier C in the waiting position 135, carries it to an empty substrate carrier in the carrier holding section 132, and sets it there. The auxiliary arm 121 gets access to the set substrate carrier C and takes the wafer W in and out of the substrate carrier C.

In the processing apparatus according to this embodiment, the substrate carriers C are carried one by one to the carrier holding section 132 by means of the carrier transfer arm 140, which enables the carrier transfer arm 140 itself to be reduced in size. Moreover, a drive mechanism of the carrier transfer arm 140 is simple, thereby seldom causing trouble.

As shown in FIG. 13, an air cleaning mechanism FFU can be disposed above the carrier holding section 132, which makes it possible to keep the wafers W held in the carrier holding section 132 together with the substrate carrier C clean or to control the temperature thereof by clean air flow.

Next, a third embodiment will be explained. Incidentally, the explanation of portions overlapping with the aforesaid second embodiment is omitted from the third embodiment.

Figure 15:
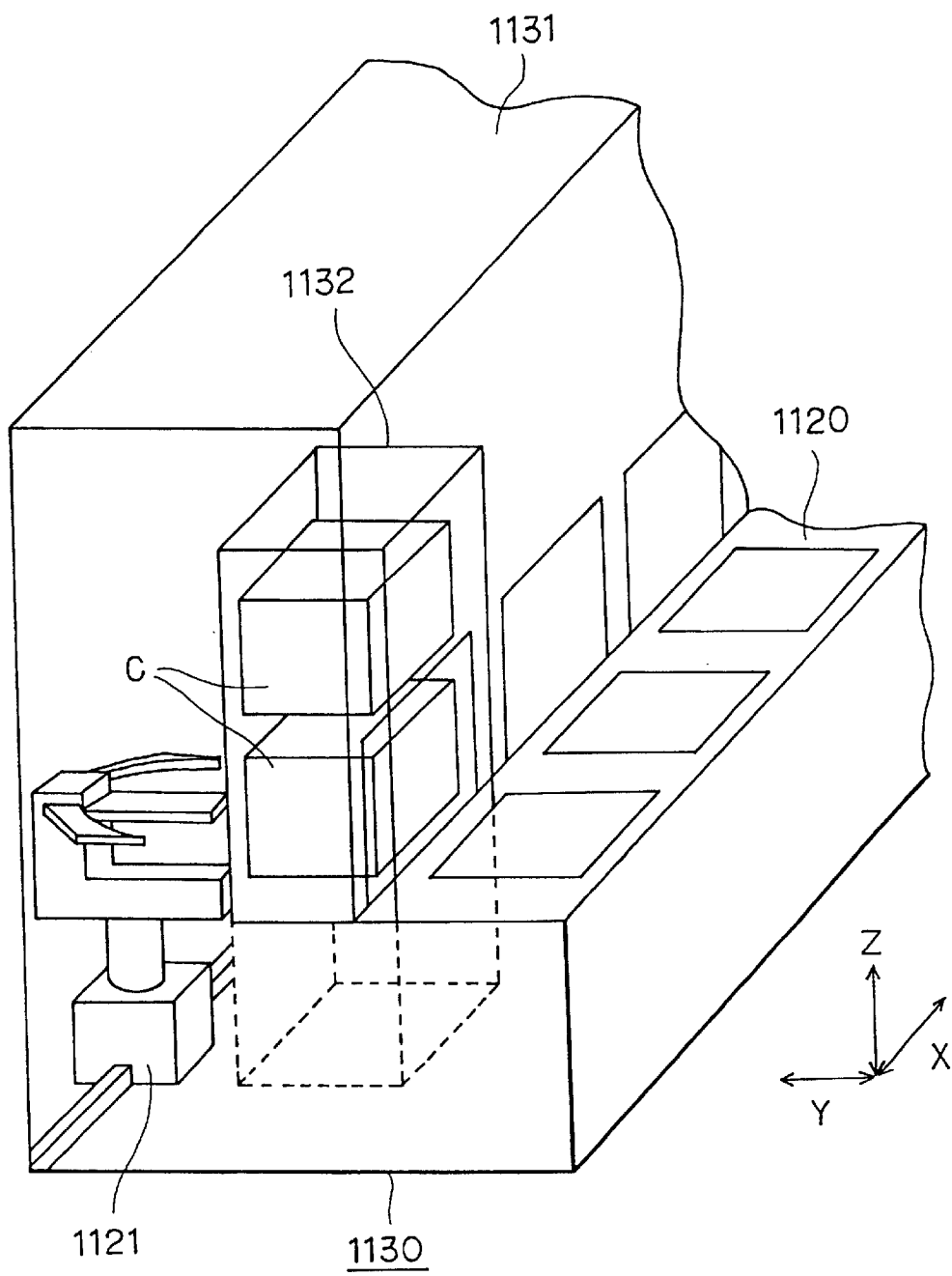
FIG. 15 is a perspective view of a substrate carrier transfer section of a coating and developing system according to a third embodiment of the present invention.
Figure 16:
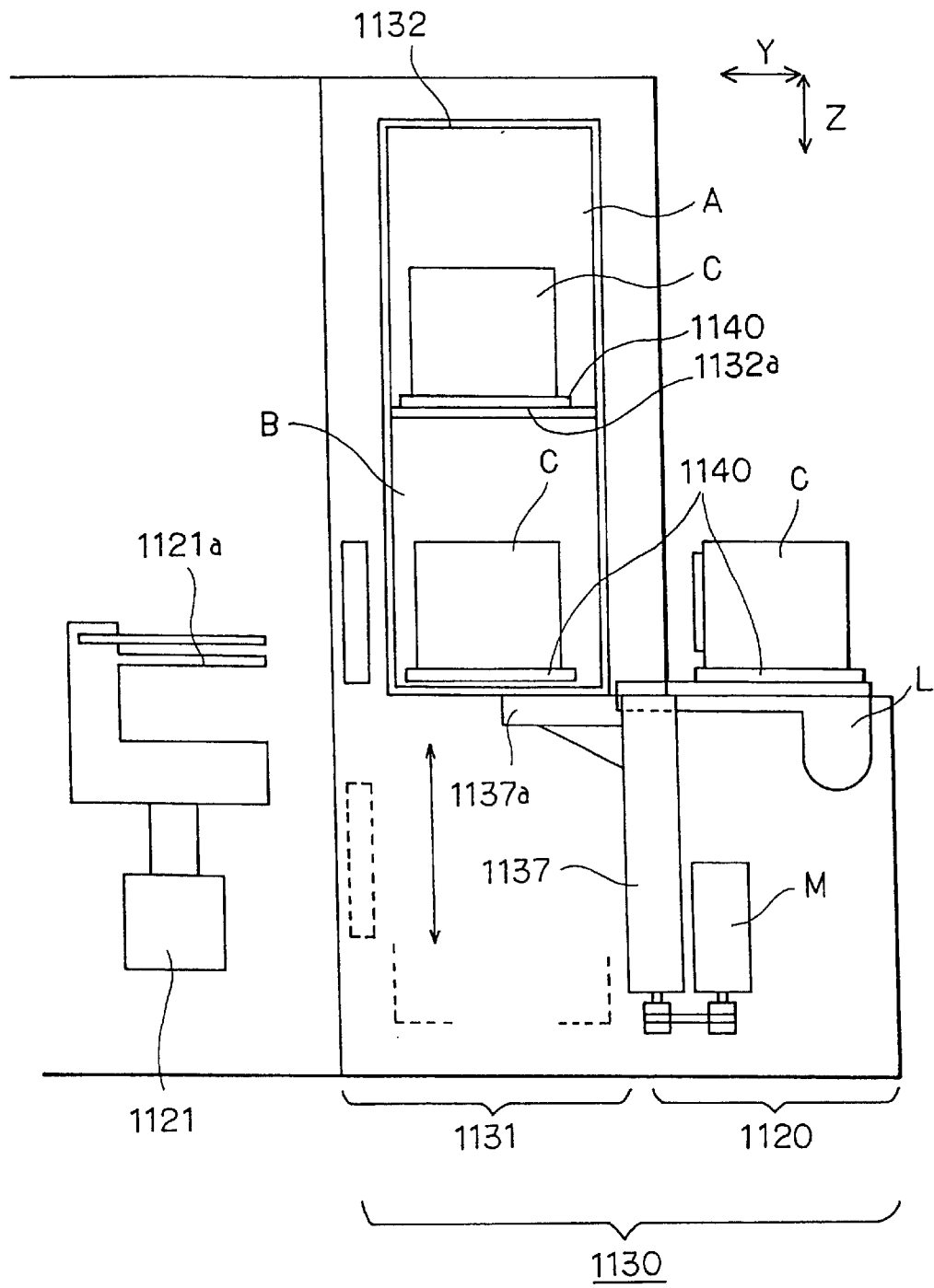
FIG. 16 is a sectional view of FIG. 15.
Figure 17:
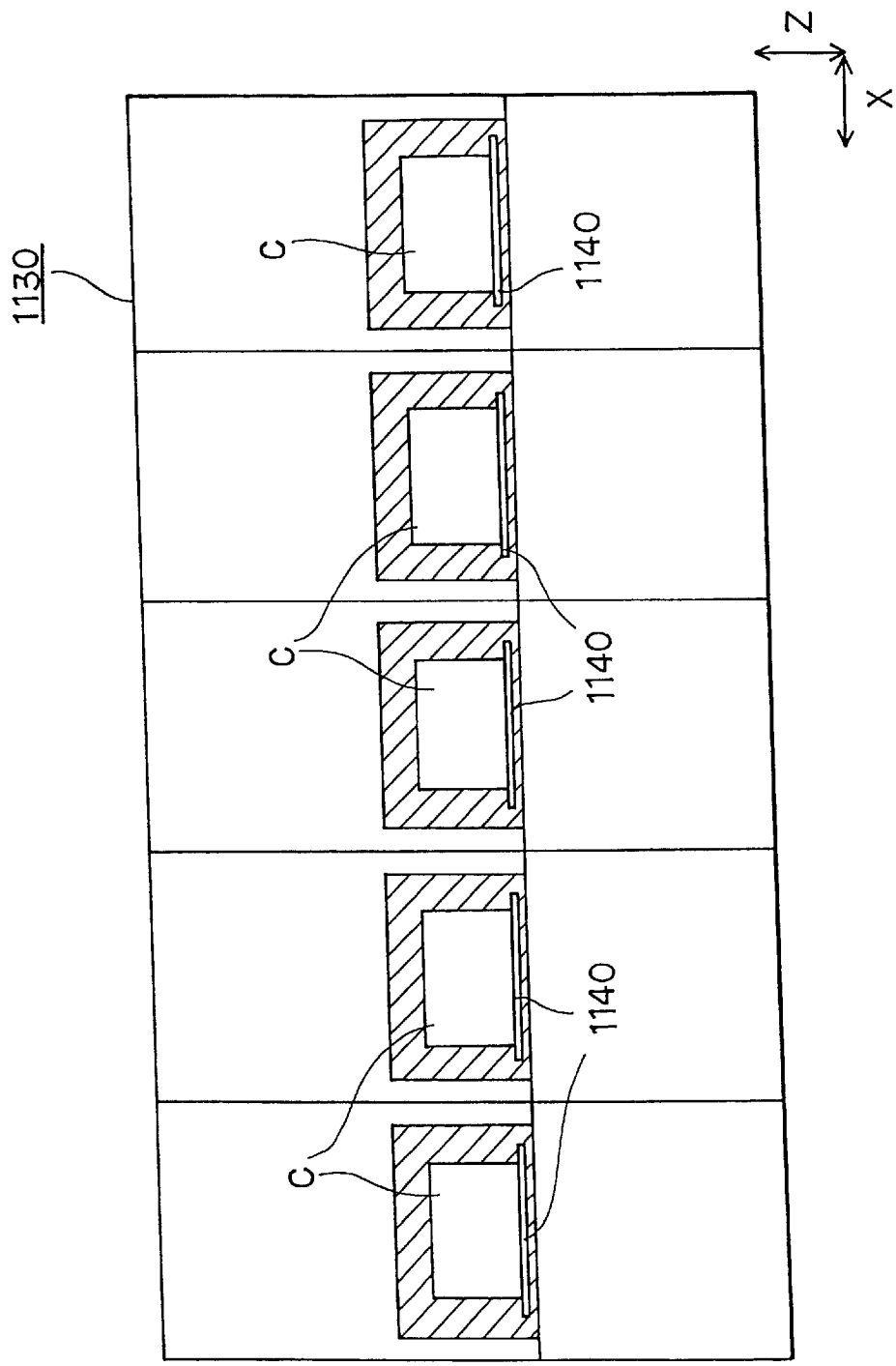
FIG. 17 is a view showing the arrangement of substrate carriers according to the third embodiment of the present invention.

FIG. 15 is a schematic view partially radioscopically showing a perspective view seen in the X-direction of a container mounting unit 1130 which is a substrate carrier transfer section located at one end of a processing apparatus according to this embodiment. FIG. 16 is a vertical sectional view of the container mounting unit 1130 cut in a plane parallel to the ZY-plane, and FIG. 17 is a view of the container mounting unit 1130 seen in the Y-direction.

As shown in FIG. 15, in the coating and developing system 100 according to this embodiment, a waiting space 1131 as a third position for making the substrate carrier C wait is provided between a substrate carrier mounting section 1120 as a first position and an auxiliary arm 1121 as a substrate transfer mechanism. A container 1132 as a second position is provided in the waiting space 1131, and the substrate carrier C held in the container 1132 is delivered to the auxiliary arm 1121. As shown in FIG. 17, in the container mounting unit 1130, five substrate carriers C can be set in the width direction of the processing apparatus, that is, in the X-direction.

As shown in FIG. 16, the rectangular parallelepiped-shaped container 1132 is disposed to be ascendable and descendable in the waiting space 1131 in the container mounting unit 1130. The container 1132 is divided into two rooms by a partition plate 1132a provided in the middle of the container 1132 in the vertical direction. Each room can accommodate one substrate carrier C, so that the container 1132 can accommodate up to two substrate carriers C.

As shown in FIG. 16, disposed adjacently on the right side of FIG. 16 of the waiting space 1131 is a container raising and lowering mechanism 1137. By actuating a raising and lowering motor M (Ml) of the container raising and lowering mechanism 1137, a container supporting portion 1137a of the container raising and lowering mechanism 1137 ascends and descends, thereby raising and lowering the container 1132. A linear drive motor L (L1) for moving the substrate carrier C linearly in the Y-direction is attached to the substrate carrier mounting section 1120 to take the substrate C and a holding member 1140 thereunder in and out between the substrate carrier mounting section 1120 and the container 1132.

Only the nearest of the containers 1132 is shown in FIG. 15 in the X-direction, and similar mechanisms are disposed in the X-direction as shown in FIG. 17, and five containers are raised and lowered parallel to one another.

Next, the procedure for processing by the substrate processing apparatus according to this embodiment will be explained.

Figure 18:
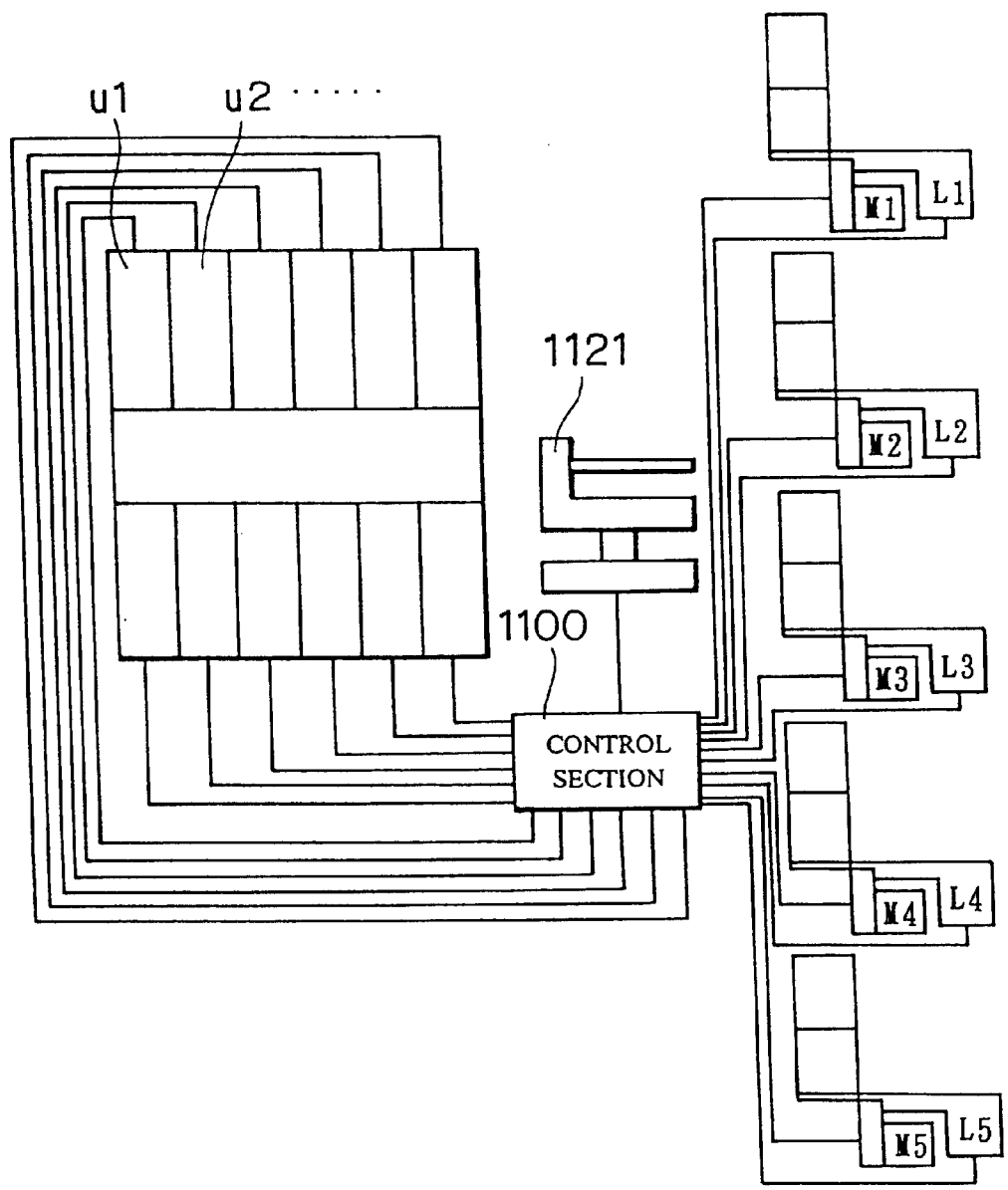
FIG. 18 is a view for explaining an operation mechanism of the coating and developing system according to the third embodiment of the present invention.

FIG. 18 is a control system diagram showing a control system of the processing apparatus according to this embodiment.

As shown in FIG. 18, in the processing apparatus according to this embodiment, respective processing units u1, u2, . . . , the auxiliary arm 1121, and the respective stepping motors M (M1 to M5) and the linear drive motors L (L1 to L5) of the container mounting unit 1130 are connected to a control section 1100. The control section 1100 controls all of them.

Specifically, the control section 1100 always knows the number of the wafers W housed in each carrier C, in which processing unit each wafer W is located, and what kind of processing each wafer W is undergoing, and while confirming the relationship with the processing state of each wafer W, properly drives the respective stepping motors M (M1 to M5) to move the position of the substrate carrier C on the mounting table.

Figure 19:
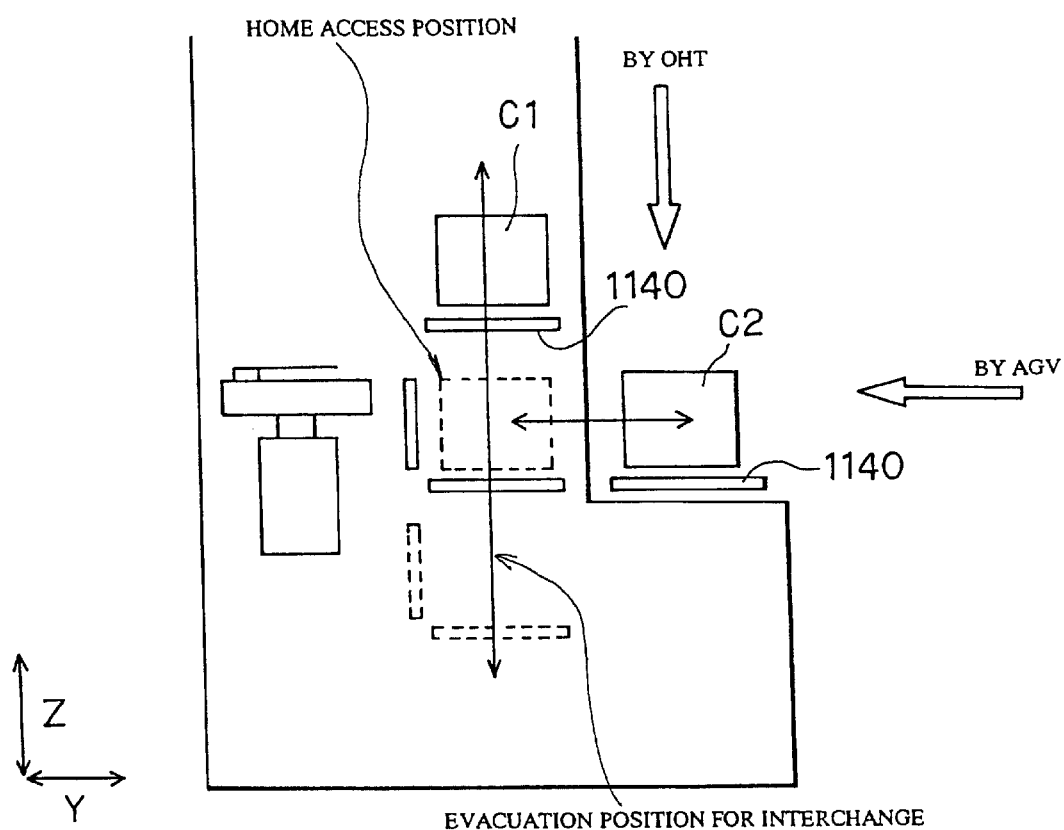
FIG. 19 is a view related to the third embodiment of the present invention, showing a state in which the position of the substrate carrier is shifted.

The procedure for moving the position of the substrate carrier C on the mounting table will be explained in detail below. FIG. 19 is a view showing a state in which the position of the substrate carrier is moved.

First, when the processing apparatus is started, a substrate carrier C1 housing the unprocessed wafers W is mounted on the holding member 1140 set on the substrate carrier mounting section 1120 of the container mounting unit 1130 in this embodiment by means of the external transfer device (not illustrated) such as the automatic transfer robot (AGV).

In this situation, the container 1132 is set in the lower position in the waiting space 1131, and a substrate carrier A on the upper side of the container 1132 is maintained at the same height as the substrate mounting section 1120.

Thereafter, the substrate carrier C1 is moved together with the holding member 1140 thereunder in the left direction of FIG. 19 by means of the linear drive motor L1, and accommodated in the upper substrate carrier A of the container 1132.

Thus, the substrate carrier C1 accommodated in the upper substrate carrier A of the container 1132 is transferred to a home access position which is a position between the substrate carrier mounting section 1120 and the auxiliary arm 1121 at a position shown in FIG. 16 (closest to this side of FIG. 16).

When the substrate carrier C1 is set in the home access position, the auxiliary arm 1121 moves to an opening on the left side of FIG. 19 of the substrate carrier C1, gets an arm portion 1121a at its forward end into the substrate carrier C1, and takes out the unprocessed wafer W housed therein. The auxiliary arm 1121 moves while holding the unprocessed wafer W taken out and delivers it to the main arm 122. The main arm 122 sets the unprocessed wafer W in a processing unit where necessary processing is performed to the wafer W.

When other unprocessed wafers W in the substrate carrier C1 are taken out by means of the auxiliary arm 1121 in the same manner as above and the substrate carrier C1 becomes empty, the raising and lowering motor M1 is driven to thereby raise the container 1132 and move a substrate carrier B on the lower side of the container 1132 to the home access position. The raise of the container 1132 allows the previously emptied substrate carrier C1 to move to the upper position of the waiting space 1131.

Subsequently, another substrate carrier C2 housing the unprocessed wafers W is mounted on the holding member 1140 of the substrate carrier mounting section 1120 in the container mounting unit 1130 by means of the external transfer device (not illustrated) such as the automatic transfer robot (AGV).

As in the case of the above substrate carrier C1, as soon as the linear drive motor L1 is actuated and the substrate carrier C2 on the substrate carrier section 1120 is accommodated in the substrate carrier B on the lower side of the container 1132, the substrate carrier C2 is moved to the home access position, where the unprocessed wafer W is taken out by the auxiliary arm 1121.

Next, the case where the wafer W which has undergone processing in respective processing units and completed a series of processing is housed in the substrate carrier C1 will be explained.

When the substrate carrier C2 is emptied, the container 1132 is lowered by driving the raising and lowering motor M1, and the previously emptied substrate carrier C1 is moved to the home access position.

The wafers W which have completed a series of processing in a processing unit group are sequentially transferred into the substrate carrier C1 waiting at the home access position via the main arm 122 and the auxiliary arm 1121 and housed therein.

When the substrate carrier C1 is filled with the processed wafers W, the control section 1100 drives the linear drive motor L1 to move the substrate carrier C1 from the upper substrate carrier A of the container 1132 to the substrate mounting section 1120. The substrate carrier C1 transferred to the substrate carrier mounting section 1120 is received by the external transfer device (not shown) such as the automatic transfer robot (AGV) and carried away from the substrate carrier mounting section 1120.

In place of the substrate carrier C1, a substrate carrier C3 (not shown) housing still other unprocessed wafers W is mounted on the substrate carrier mounting section 1120 and carried into the lower substrate carrier B of the container 1132 in the same way as above.

In order to house the processed wafer W in the substrate carrier C2 accommodated in the lower substrate carrier B of the container 1132, the raising and lowering motor M1 is driven to thereby raise the container 1132, and the substrate carrier B on the lower side is moved to the home access position. As is the case with the above substrate carrier C1, the processed wafer W is housed in the substrate carrier C2 via the processing unit group, the main arm 122, the auxiliary arm 1121 in sequence. When the substrate carrier C2 is filled with the processed wafers W, the substrate carrier C2 is replaced with a substrate carrier C housing still other unprocessed wafers W via the linear drive motor L1 and the external transfer device in the same way as the substrate carrier C1.

As explained above, the waiting space 1131 is provided between the auxiliary arm 1121 and the mounting table, and a plurality of substrate carriers C are vertically accommodated in the waiting space 1131 in the processing apparatus according to this embodiment, thus improving accommodating capacity of the substrate carriers C.

Further, as the waiting space 1131 is disposed in the interior of the processing apparatus, any collision between an external transfer device and a mechanism disposed in the waiting space 1131, (e.g. a container 1132, a container raising and lowering mechanism) can be prevented.

Furthermore, in this processing apparatus, five waiting spaces are disposed in the width direction of the processing apparatus (in the X-direction), and five substrate carriers C which can be set on the carrier mounting table 1120 move separately from and independently of one another. As a result, the substrate carrier C can be taken in/out, and the auxiliary arm can get access to the carrier in a short time.

It should be noted that the present invention is not limited to the aforesaid embodiments. Although the container 1132 is provided with the vertically two-tiered substrate carriers A and B in the aforesaid embodiments, for example, a container provided with vertically three or more-tiered substrate carriers may be used.

Moreover, in the aforesaid embodiments, the case where the substrate carrier C is carried in and out by means of the automatic transfer robot AGV is explained as an example of the external transfer device. It is also possible, however, to use some existing transfer device other than the automatic transfer robot (AGV) such as an overhead type OHT which transfers the substrate carrier C while gripping it from a high position on the ceiling side.

Next, a fourth embodiment of the present invention will be explained.

Figure 20:
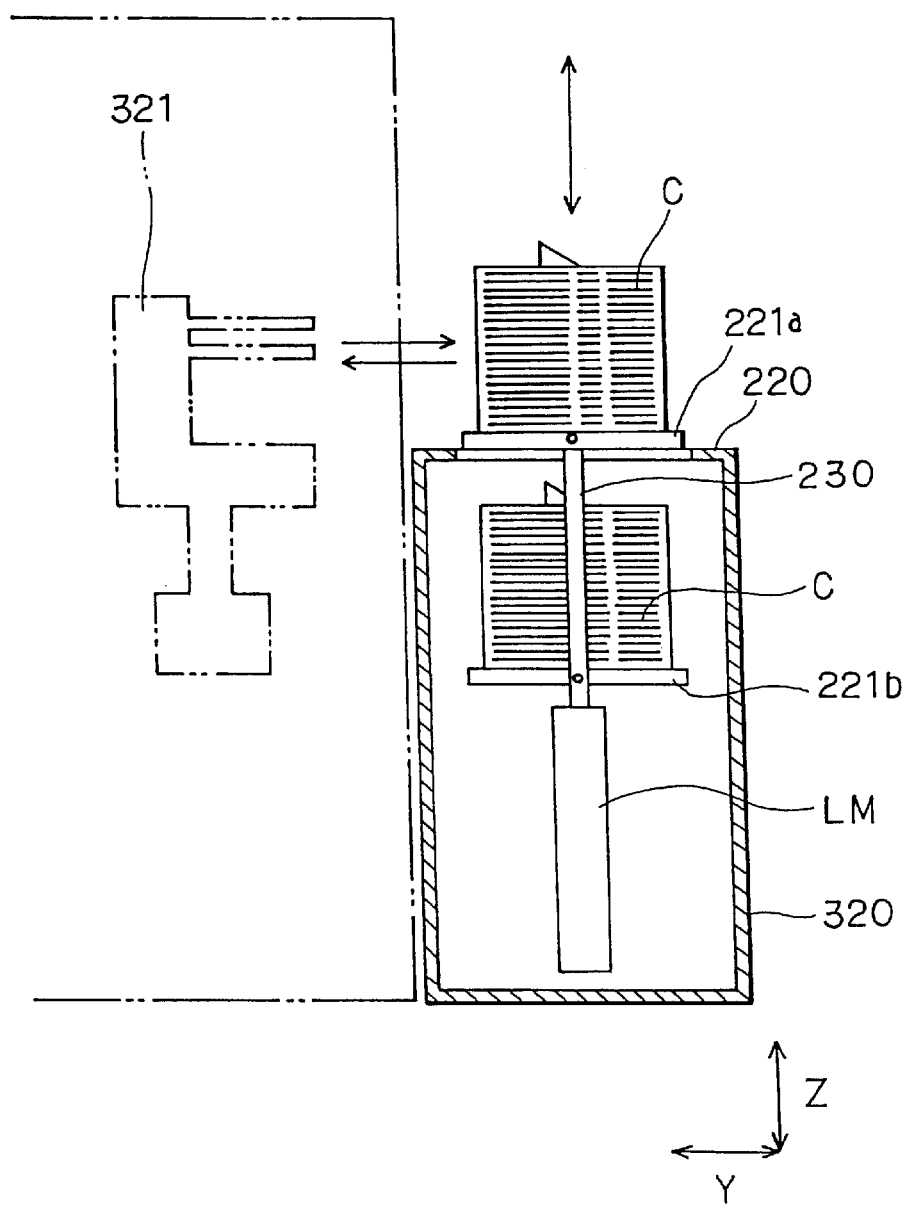
FIG. 20 is a sectional view of a substrate carrier transfer section of a coating and developing system according to a fourth embodiment of the present invention.

FIG. 20 is a vertical sectional view of a container mounting unit as a substrate carrier transfer section according to this embodiment.

In the container mounting unit according to this embodiment, a base plate 221 portion of a substrate carrier mounting section 220 is structured to ascend and descend. In other wards, two horizontal base plates 221a and 221b which are vertically provided leaving a space more than the height of the substrate carrier C between them are connected with a connecting rod 230, and vertically move by connecting the lower half of the connecting rod 230 with a drive section of a linearly operating linear drive motor LM such as an air cylinder.

In the container mounting unit, first the substrate carrier C housing the unprocessed wafers W is mounted on the lower tier and the unprocessed wafers W are brought into a processing unit group by means of an auxiliary arm 321. When the substrate carrier C at the lower tier is thus emptied, a linear drive motor LM is actuated, and the base plate 221b at the lower tier is lowered while the empty substrate carrier C is mounted thereon and accommodated in a housing 320. The base plate 221a at the upper tier is set on the substrate carrier mounting section 220 by the above lowering operation. Subsequently, another substrate carrier C housing the unprocessed wafers W is mounted on the upper base plate 221a.

The container mounting unit according to this embodiment has a simple structure in which only the base plates 221a and 221b of the substrate carrier mounting section 220, the connecting rod 230 for connecting these base plates, and the linear drive motor LM for driving these base plates and connecting rod are added, thereby reducing manufacturing costs. The floor area of the container mounting unit basically does not need to be increased, whereby the floor area occupied by the whole processing apparatus is not increased, while the accommodating capacity of the substrate carriers C is almost doubled per unit area, thus improving space efficiency.

Next, a fifth embodiment of the present invention will be explained.

Figure 21:
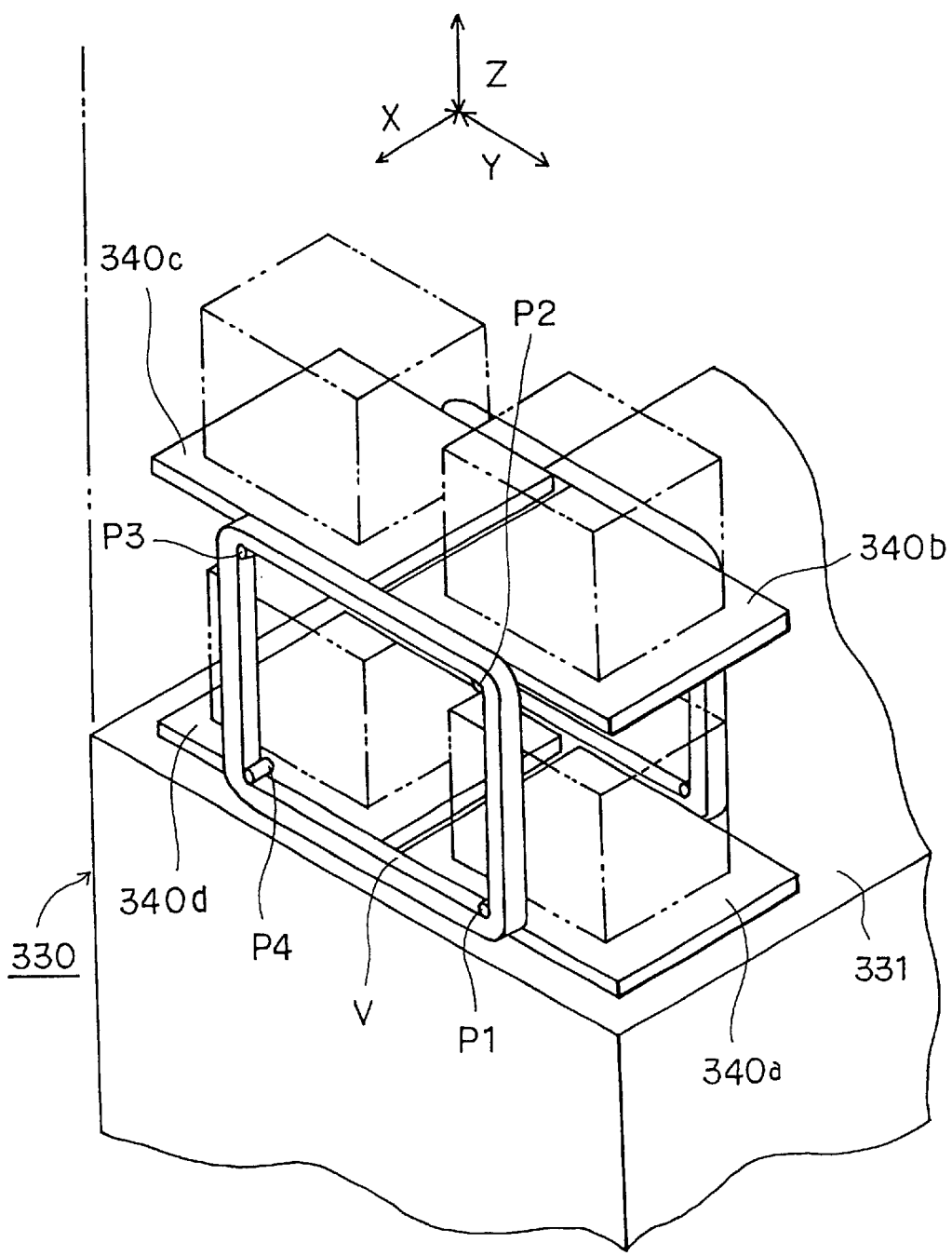
FIG. 21 is a perspective view of a substrate carrier transfer section of a coating and developing system according to a fifth embodiment of the present invention.
Figure 22:
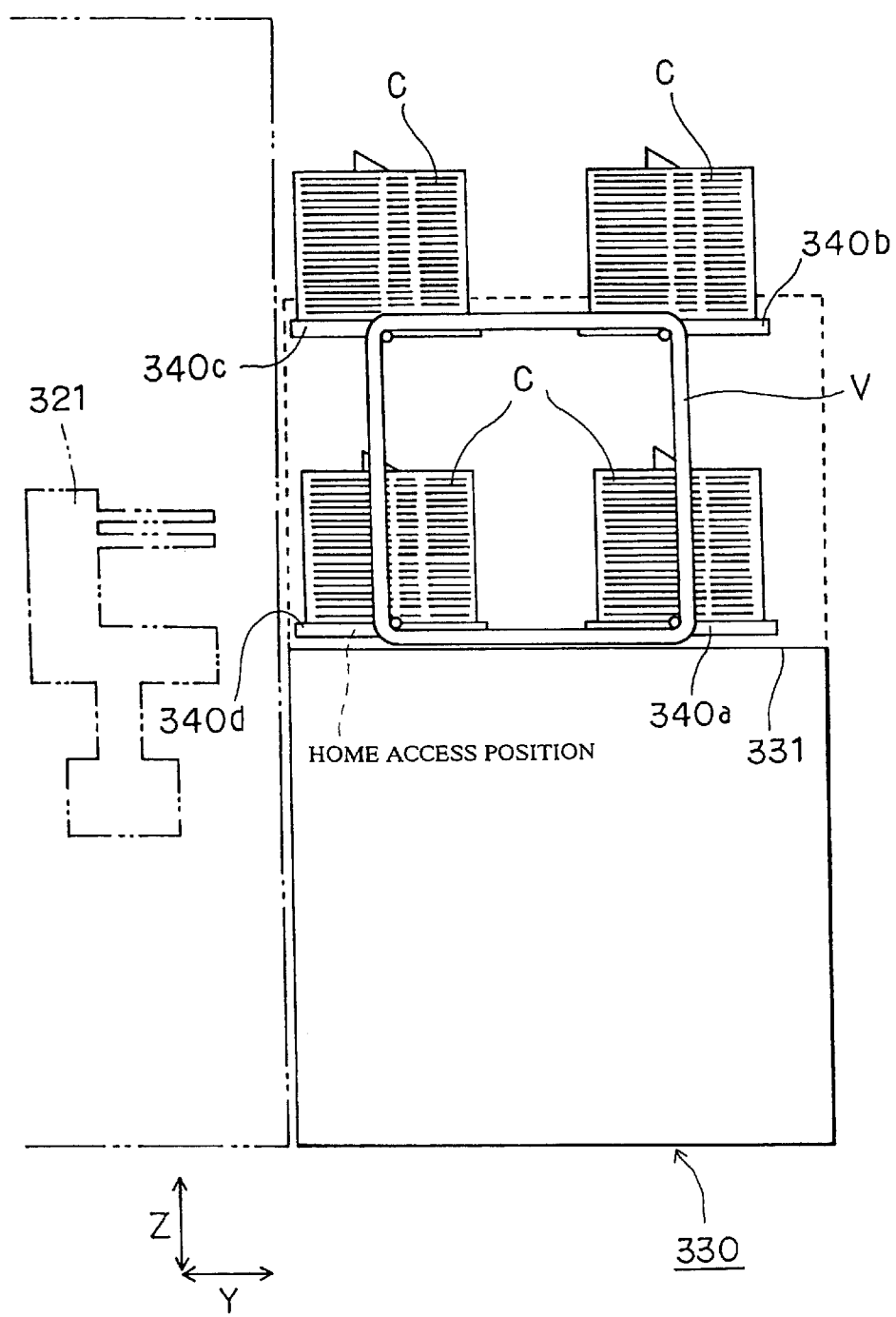
FIG. 22 is a sectional view of FIG. 21.

FIG. 21 is a perspective view of a container mounting unit as a substrate carrier transfer section according to this embodiment, and FIG. 22 is a vertical sectional view of the container mounting unit.

In a container mounting unit 330 according to this embodiment, four substrate carriers C are held above a substrate carrier mounting section 331 while circularly moved in a vertical plane parallel to a YZ-plane.

Specifically, in the container mounting unit 330 according to this embodiment, as shown in FIG. 21, holding members 340a to 340d are disposed vertically in two tiers, two members in each tier in the Y-direction, in a space above the substrate carrier mounting section 331 so as to hold the substrate carriers C. The total of four holding members 340a to 340d are engaged with an endless band-shaped member, for example, a belt, a chain, or the like.

This endless band-shaped member (The "endless band-shaped member" is called "an endless belt" for short hereinafter.) V is wound around pulleys p1 to p4 attached at the four corners of a square on the aforesaid vertical plane, and the pulley p1 is given driving force by a drive mechanism and a drive motor (not shown). The drive motor is controlled by a control section, actuated in synchronization with an auxiliary arm 321, a main arm, or a processing unit recognized by the control section, and moves in sequence among four positions shown in FIG. 22.

In the container mounting unit 330, the lower left position of FIG. 22 out of the four positions shown in FIG. 22 is used as a home access position (a second position), and the lower right position or the upper right position of FIG. 22 is used as a first position at which the substrate carrier C is transferred to/from the external transfer device. Two positions other than the home access position (the second position) and the first position out of the four positions in FIG. 22 are used as waiting sections (third positions).

The container mounting unit 330 according to this embodiment adopts a structure in which the four holding members held in the vertical plane parallel to the YZ-plane above the substrate carrier mounting section 331 are circularly moved by the endless belt V, thus improving space efficiency in the Y-direction.

Further, a plurality of mechanisms such as shown in FIG. 21 can be disposed in the X-direction in the container mounting unit 330 according to this embodiment. When four of such mechanisms are disposed in parallel in the X-direction, for example, up to 16 substrate carriers C can be accommodated, which can significantly improve the accommodating capacity of the substrate carriers C.

Furthermore, when the aforesaid mechanisms are disposed in parallel in the X-direction, each mechanism can move the positions of the holding members 340a to 340d separately from and independently of the other mechanisms, which can reduce the time spent before the necessary substrate carrier C gets access to the auxiliary arm 321.

Next, a sixth embodiment of the present invention will be explained.

Figure 23:
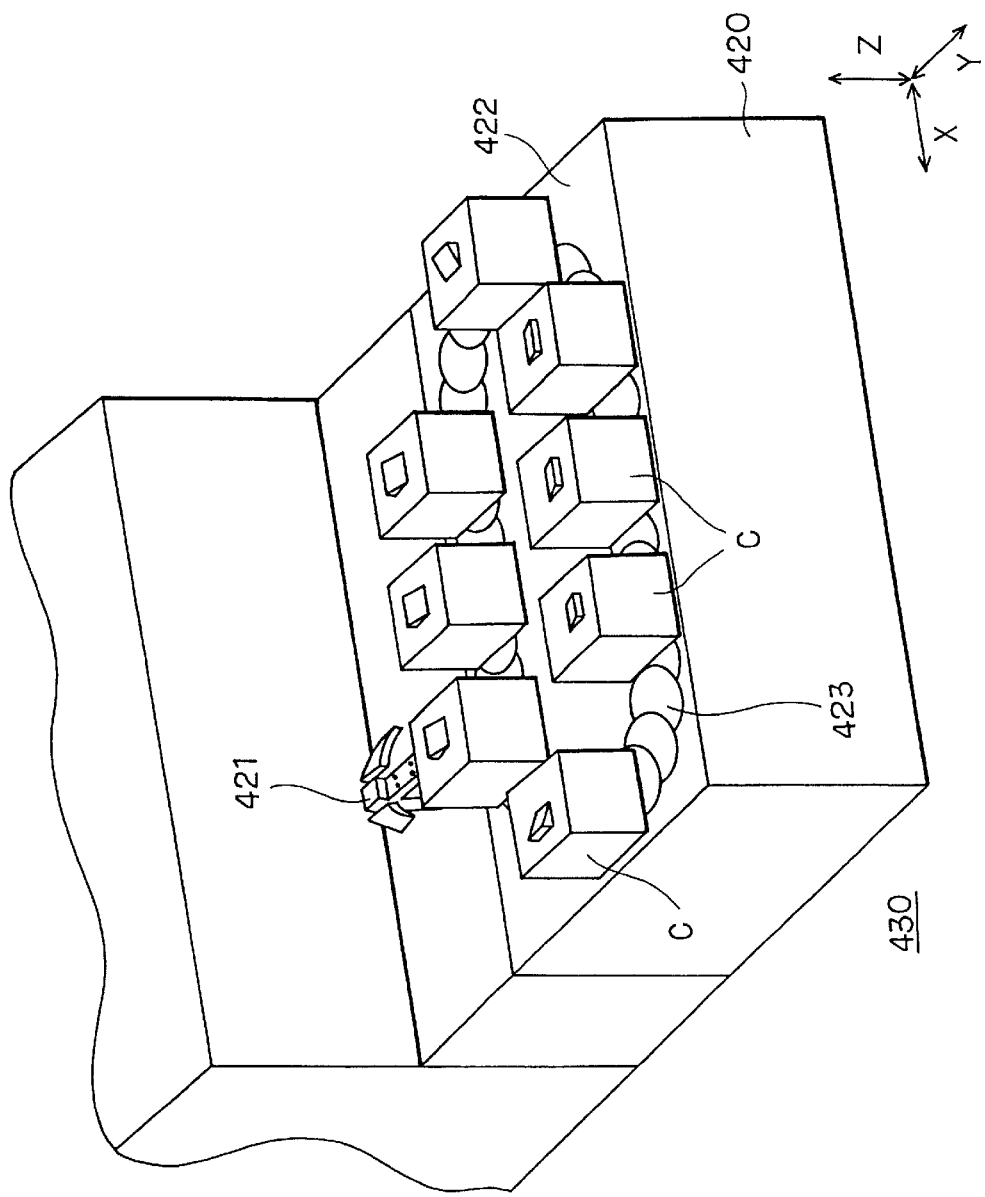
FIG. 23 is a perspective view of a substrate carrier transfer section of a coating and developing system according to a sixth embodiment of the present invention.

FIG. 23 is a perspective view of a container mounting unit 430 as a substrate carrier transfer section according to this embodiment.

In the container mounting unit 430 according to this embodiment, a plurality of substrate carriers C are mounted on an elliptical trajectory provided on a horizontal substrate carrier mounting section 420.

Namely, a horizontal plate-shaped top plate 422 is provided at the same height as the bottom of the substrate carrier C set in the aforesaid home access position and an elliptically moving endless trajectory 423 is disposed on the top plate 422 in the container mounting unit 430 according to this embodiment. The endless trajectory 423 is driven by a drive mechanism provided inside the container mounting unit 430 and a drive motor (not shown) driving the drive mechanism, and circularly moves in the horizontal plane describing an ellipse with a major axis in the X-direction.

According to the container mounting unit 430 according to this embodiment, a plurality of substrate carriers are circularly moved while maintained at the same height as the home access position, whereby the alignment in the vertical direction with the auxiliary arm 421 can be performed in a short time.

Further, one drive motor and one drive mechanism are enough for one endless trajectory, thus keeping manufacturing costs inexpensive.

Furthermore, except the bottoms of the plurality of the substrate carriers C, the container mounting unit 430 is in an open state without being restricted to the endless trajectory 423, and as a result it is adaptable to both the automatic transfer robot (AGV) getting access in the horizontal direction and the external transfer device getting access in the vertical direction.

Next, a seventh embodiment of the present invention will be explained.

Figure 24:
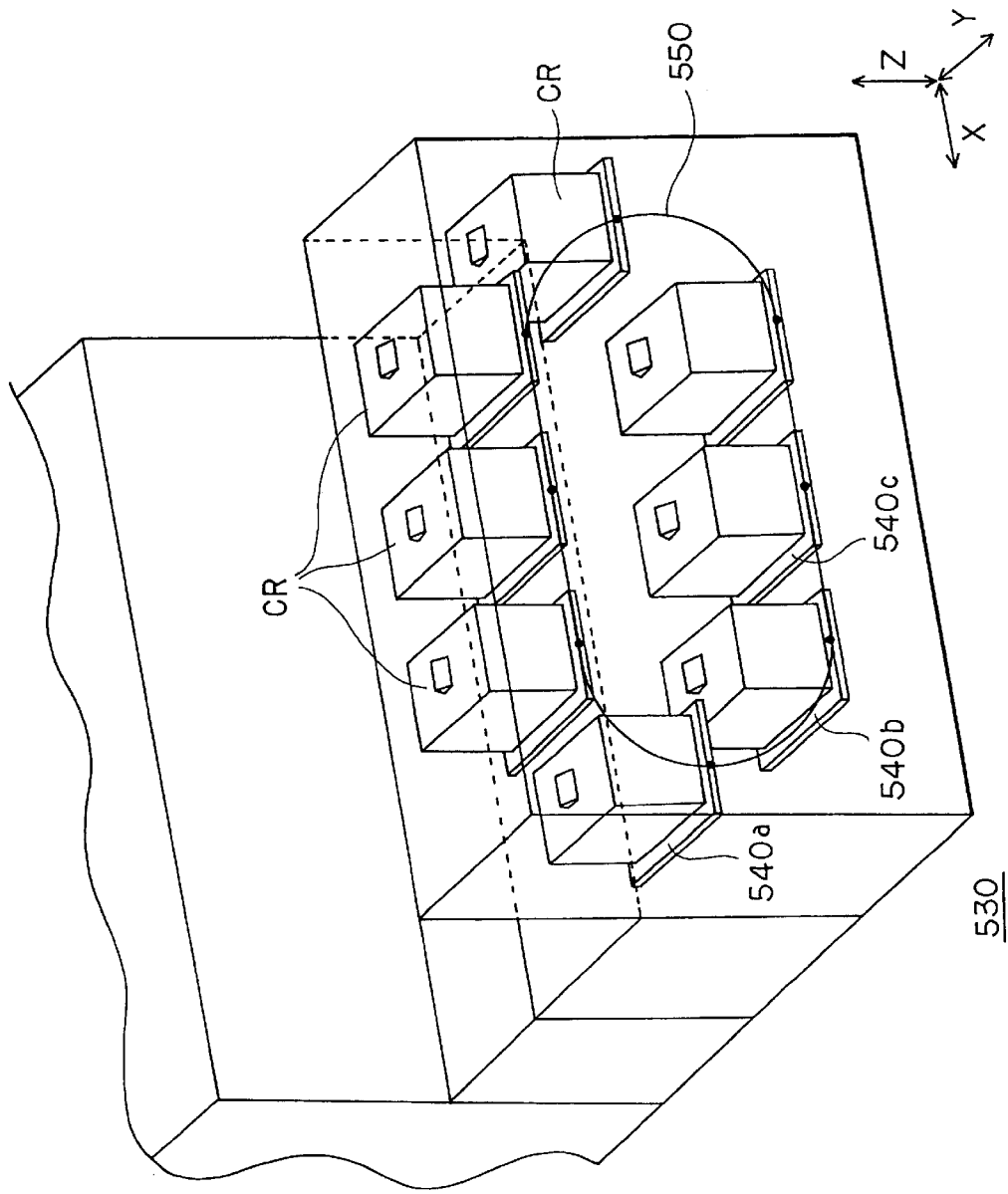
FIG. 24 is a perspective view of a substrate carrier transfer section of a coating and developing system according to a seventh embodiment of the present invention.

FIG. 24 is a perspective view of a container mounting unit 530 according to this embodiment.

In the container mounting unit 530 according to this embodiment, a plurality of substrate carriers C are moved while held on an elliptical trajectory provided in a vertical plane in the container mounting unit 530.

In other words, a plurality of holding members 540b, 540c, . . . are held at even intervals on a vertical plane passing the position of a holding member 540a for the substrate carrier C held at the aforesaid home access position and held to be movable on an elliptical trajectory 550 provided on the vertical plane. A drive mechanism and a drive motor (both not shown) are engaged with these holding members 540b, 540c, . . . to circularly move them on the above trajectory.

According to the container mounting unit 530 according to this embodiment, a plurality of substrate carriers are circularly moved in a vertical plane while held at positions in the Y-direction just like the home access position, which makes it possible to increase the accommodating capacity of the substrate carriers C without increasing the floor area of the container mounting unit 530, thereby improving space efficiency.

Next, an eighth embodiment of the present invention will be explained.

Figure 25:
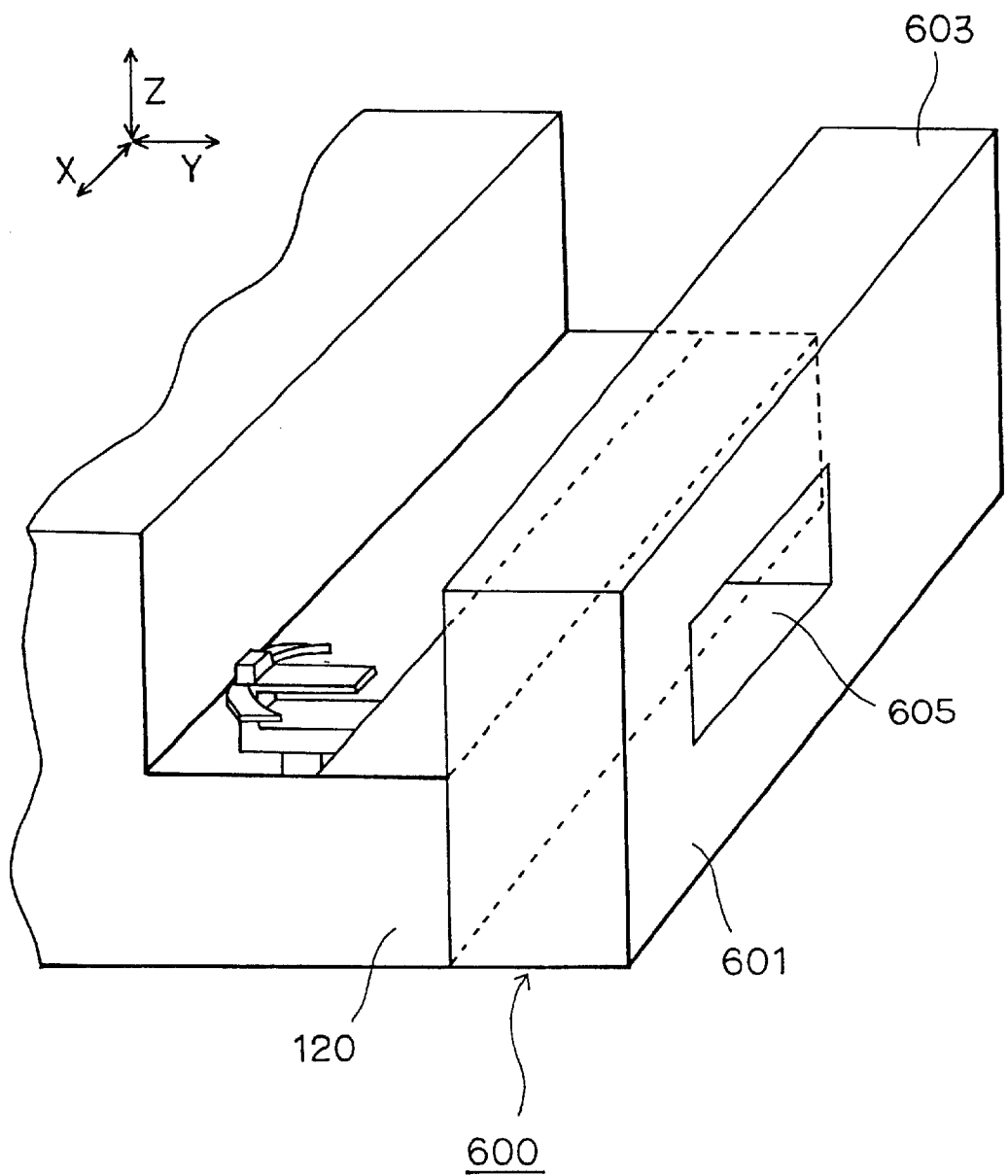
FIG. 25 is a schematic perspective view of a substrate carrier transfer section of a coating and developing system according to an eighth embodiment of the present invention.
Figure 26:
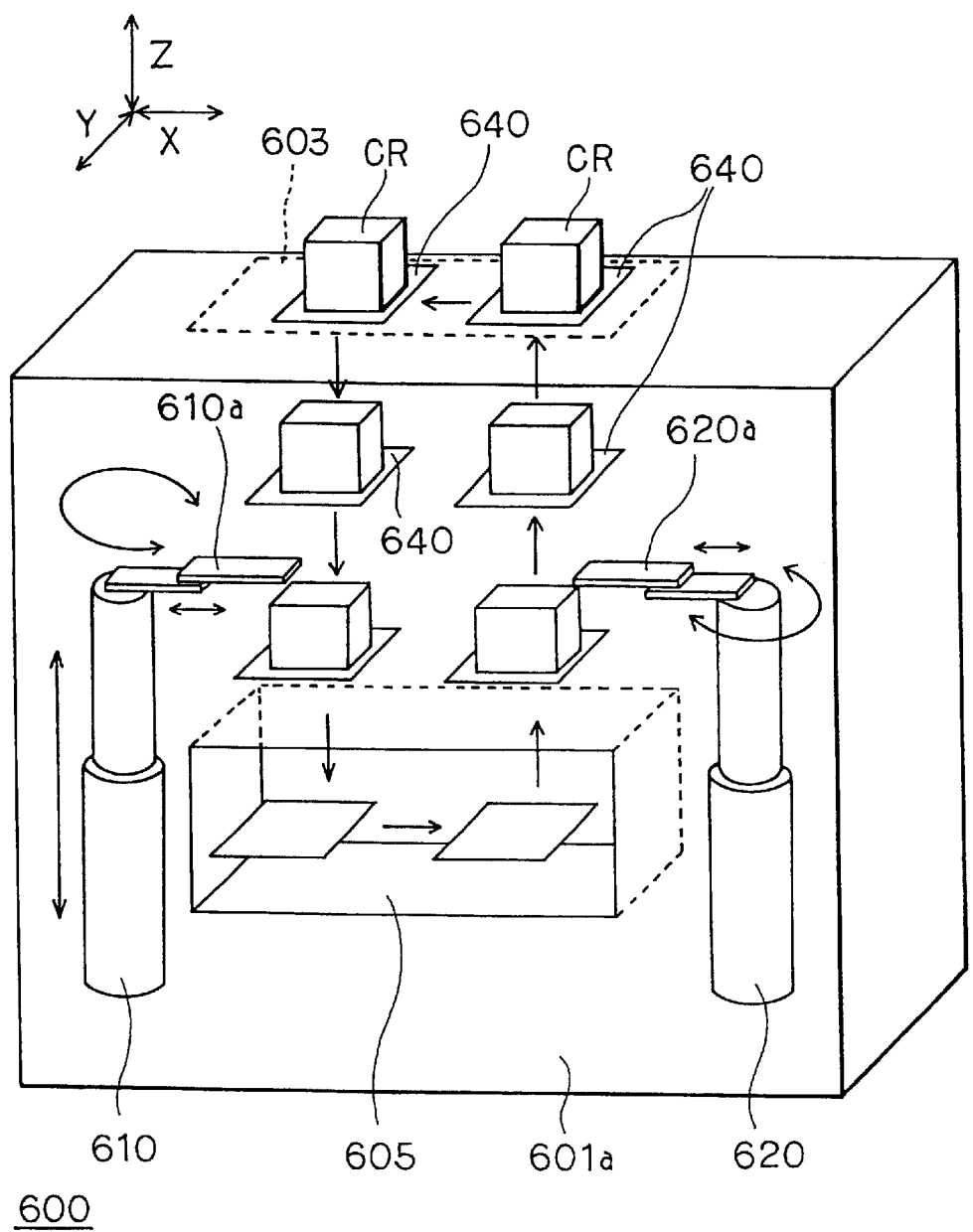
FIG. 26 is a view showing a state in which the positions of substrate carriers of the coating and developing system according to the eighth embodiment of the present invention are moved.

FIG. 25 is a perspective view of a container accommodating apparatus (stocker) 600 according to this embodiment as is seen in the X-direction. FIG. 26 is a perspective view of the container accommodating apparatus 600 as is seen in the Y-direction.

The container accommodating apparatus 600 according to this embodiment is an apparatus separate from and independent of the processing apparatus, and it is disposed adjacent to the mounting table 120 of the processing apparatus.

The container accommodating apparatus (The "container accommodating apparatus" is called "a stocker" hereinafter.) 600 is composed of an almost rectangular parallelepiped-shaped housing 601 as a whole, and a size in a longitudinal direction is nearly the same as the width of the processing apparatus, that is, a size in the X-direction. A top plate opening 603 is provided at the top of the housing 601, which is for an external transfer device called "an overhead type transfer device (OHT)" approaching from above.

A front opening 605 is provided in the front face of the housing 601, that is, in the vicinity of the center of a face 601a facing the mounting table 120 of the processing apparatus. The substrate carrier C is transferred between an external transfer device called "automatic transfer robot (AGV)" which approaches in the horizontal direction and the mounting table 120 of the processing apparatus through the front opening 605.

FIG. 26 is a perspective view schematically showing the internal structure of the stocker 600 according to this embodiment.

As shown in FIG. 26, the stocker 600 has a structure in which the substrate carriers C are held vertically. The plurality of substrate carriers C circularly move in sequence in a vertical plane as illustrated. For a mechanism for moving the substrate carriers C, a known mechanism using a drive mechanism with a chain, an endless belt, or the like and a drive motor for driving the drive mechanism (both not shown) can be utilized.

The plurality of substrate carriers C circularly move in the vertical plane and between the upper top plate opening 603 and the lower front opening 605 by means of the drive mechanism as illustrated.

The delivery of the substrate carriers C are performed by two carrier transfer arms 610 and 620 respectively disposed on the left and right sides of the drive mechanism.

The carrier transfer arms 610 and 620 each basically have a structure very similar to the main arm 22 of the processing apparatus, ascendable and descendable in the Z-direction, and rotatable around a Z-axis.

Arm portions 610a and 620a at the forward ends of the carrier transfer arms 610 and 620 can be freely extended and contracted in a radial direction with a rotation axis (the Z-axis) as a center.

In this stocker 600, in order that the substrate carrier C is carried into/out of the external transfer device, the external transfer device directly gets the substrate carrier C in/out of a holding member 640 circularly moving in the stocker 600.

For example, when being transferred from/to the automatic transfer robot (AGV), the substrate carrier C is moved to the front opening 605 by an arm of the robot to be mounted on the holding member 640 waiting at the front opening 605, or the substrate carrier C is received from the holding member by the robot.

When being transferred from/to the overheat type transfer device (OHT), the substrate carrier C is moved to the top plate opening 603 by an arm of the transfer device (OHT) to be mounted on the holding member 640 waiting at the top plate opening 603, or the substrate carrier C is received from the holding member by the transfer device.

Thus, the substrate carrier C received from the external transfer device is accommodated and stored while being held by the holding member 640 of the drive mechanism.

Meanwhile, when the substrate carriers C thus accommodated and stored are transferred from/to the processing apparatus, the aforesaid carrier transfer arms 610 and 620 are used.

Specifically, the carrier transfer arms 610 and 620 get access to the substrate carriers C held on the holding members 640, take the desired carriers C away from the holding members 640, and put them on the arms 610a and 620a. Subsequently, the carrier transfer arms 610 and 620 themselves operate to carry the substrate carriers C held by the arms 610a and 620a to the mounting table 120 section of the processing apparatus and set them on the mounting table 120.

When the substrate carriers C are received from the mounting table 120, the substrate carriers C on the mounting table 120 are mounted on the holding members in the stocker 600 in the order reverse to the above.

The stocker 600 has the structure of being disposed adjacent to the processing apparatus. Hence, it can be additionally attached to the processing apparatus as an option by post-attachment. The processing apparatus itself does not need any change, thus producing an advantage that the conventional apparatus just as it is can be used.

Next, a ninth embodiment of the present invention will be explained.

Figure 27:
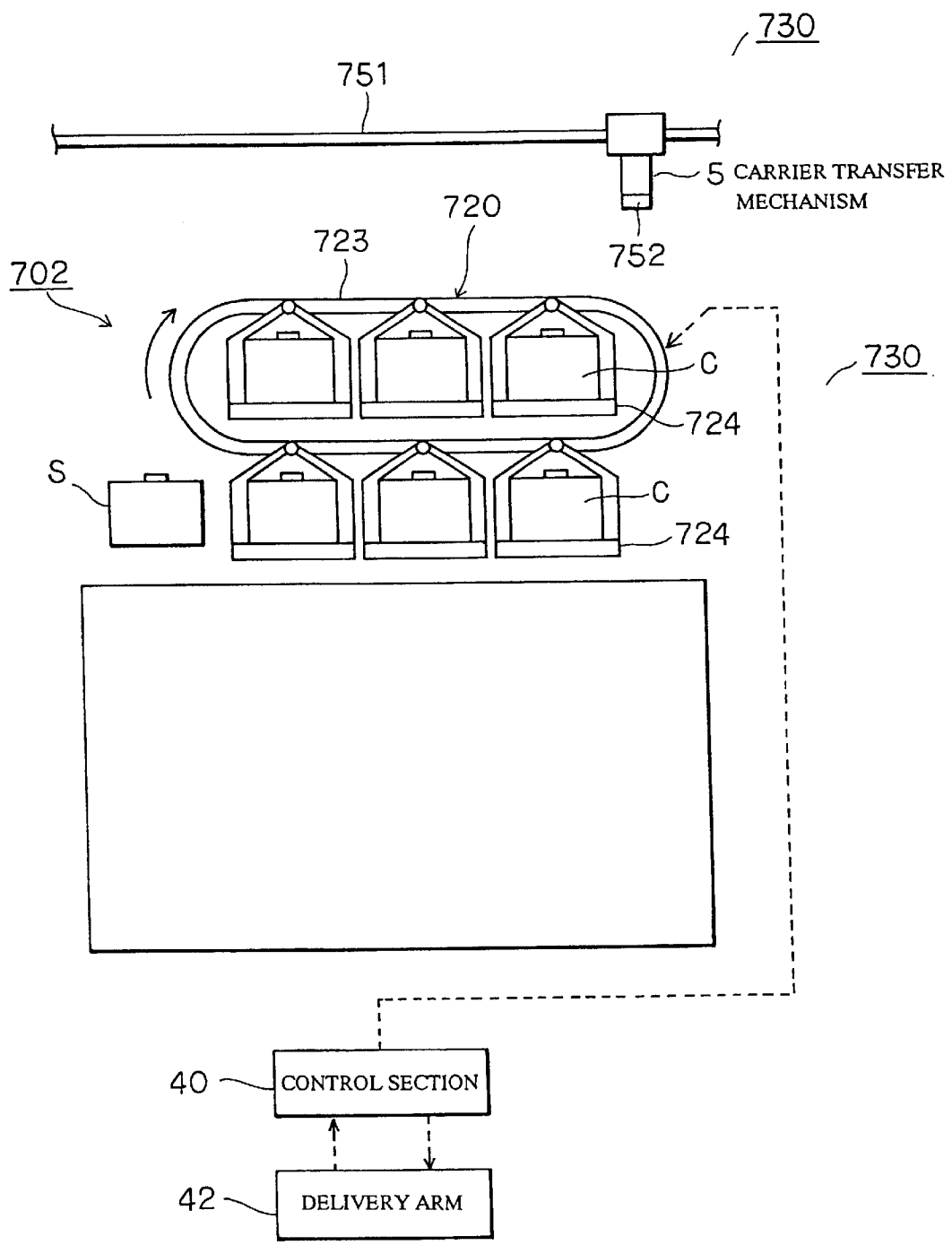
FIG. 27 is a view showing a substrate carrier transfer section of a coating and developing system according to a ninth embodiment of the present invention for explaining a substrate carrier transfer mechanism.

FIG. 27 is a sectional view of a container mounting unit 730 as a carrier transfer section according to this embodiment, when the substrate transfer section is regarded as located at the front and the processing section is seen from the substrate carrier transfer section. Moreover, here, the position of the substrate carrier transfer section is regarded as the front, and the positions of the right and left (lateral direction), front and rear are based on this direction when the processing section is seen from the substrate carrier transfer section. Incidentally, the explanation of the same structure as in the first embodiment is partially omitted.

In the container mounting unit 730, a drive mechanism 720 for circularly moving a plurality of substrate carriers C, although not specially limited, for example, six substrate carriers C in the vertical and lateral direction is provided as shown in FIG. 27. In addition, a pickup fixed carrier S for housing dummy wafers or the like is provided in the carrier transfer section 2.

Figure 28:
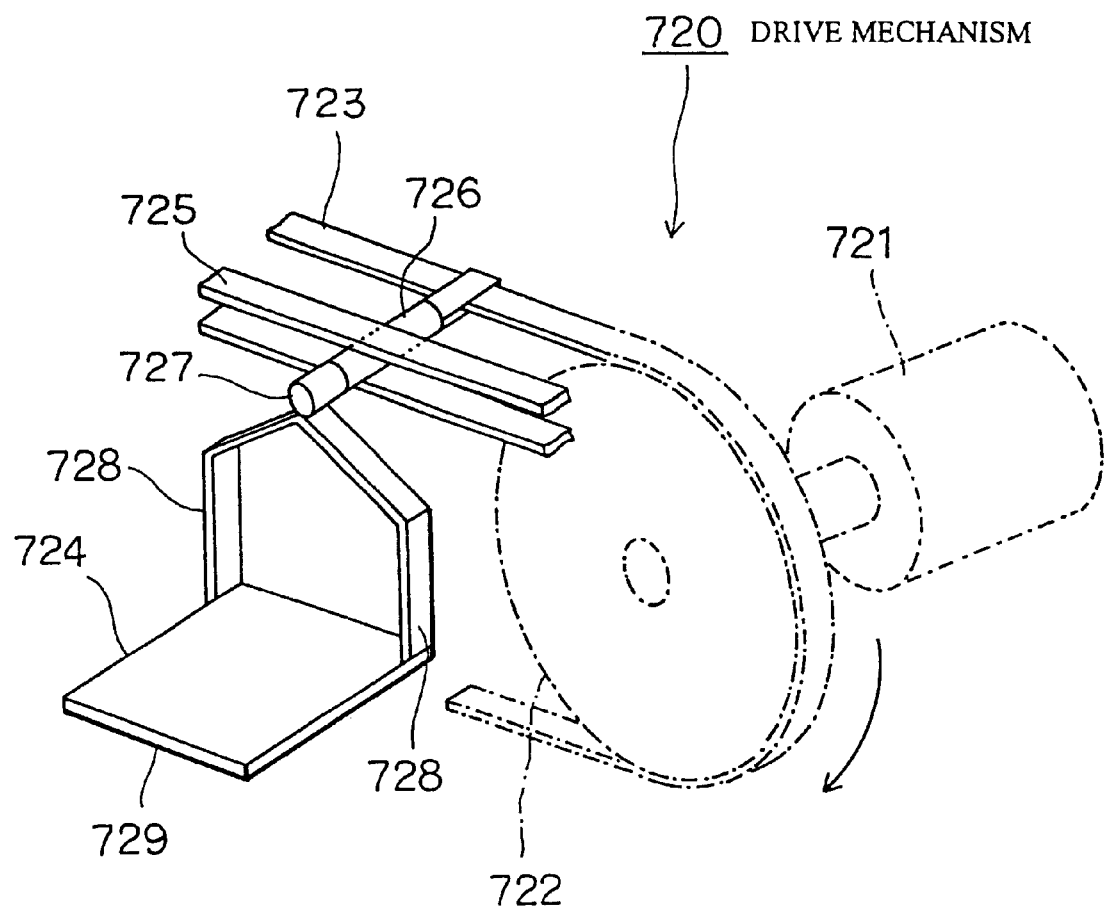
FIG. 28 is a perspective view showing means for moving substrate carriers according to the ninth embodiment of the present invention.

The drive mechanism 720 is provided with a gear 722 rotationally driven by a motor 721, timing belt (including a chain) 723 wound between the gear 722 and another gear (not shown), substrate carrier mounting tables 724 which are, for example, six holding members fixed to the timing belt 723 so as to be rotatable at given intervals, and guide members 725 for guiding the circular movement of the substrate carrier mounting tables 724 as shown in FIG. 27 and FIG. 28. The drive of the motor 721 is controlled by a control section 40. It should be noted that the drive mechanism 720 is not limited to the above structure.

Although not specially restricted, the timing belt 723 is wound, for example, to form a size such that three carrier mounting tables 724 are arranged side by side at each of two tiers. The carrier mounting table 724 has a structure in which a rotating portion 727 is rotatably attached to the forward end of a supporting shaft 726 fixed to move integrally with the timing belt 723 and a board 724 which is a mounting table is laid between the lower ends of a pair of hanging members 728 hung from the rotating portion 727. Therefore, the carrier mounting tables 724 are circularly moved while maintained in nearly horizontal position just like a Ferris wheel. Further, the carrier mounting table 724 is provided with a guide member (not shown) for positioning the bottom of the carrier C and the like.

The guide member 725 is composed of, for instance, a pair of rails holding the supporting shaft 726 of the carrier mounting table 724 between them, and it supports loads of the carrier mounting table 724 and the carrier C so that the carrier mounting table 724 can move smoothly. If the carrier mounting table 724 can move smoothly, the guide member 725 is not necessarily required.

The carrier transfer mechanism 5 is provided above the coating and developing system 100, for example, in the vicinity of the ceiling of the clean room. The carrier transfer mechanism 5 can move while being guided by a guide member 751, for example, extending almost horizontally in the lateral direction, and it is provided with a hanging member 752 passing under the handle C2 of the carrier C to engage with the handle C2. The hanging member 752 is movable back and forth, and up and down, and delivers the carrier C to the carrier mounting table 724 located in the aforesaid first position, wherein the first position is one position at the upper tier out of two tiers in this embodiment. Incidentally, the carrier transfer mechanism 5 is not limited to the structure in which the substrate carrier C is hung. For example, it may have a structure in which the substrate carrier C is held by the side faces with a pair of opening and closing arms.

The control section 40 gets information on the position of the hanging member 752 of the carrier transfer mechanism 5, the position of each lot of wafers in each carrier C and the position of each carrier C on the carrier transfer section 2, the processing conditions of the wafers W in each carrier C (information as to which wafer W in which slot is already processed, which wafer W in which slot is not yet processed, and the like), information on the position of the wafer transfer mechanism 4 and whether the delivery is being performed or not, and the like, monitors the entire apparatus, and when all the wafers W in one carrier C are processed, for example, determines whether the carrier C in the first position of the container mounting unit 730 houses unprocessed wafers, or houses processed wafers and is waiting to be carried out, and moreover confirms that the wafer W is not delivered to the carrier C by the wafer transfer mechanism 4, and then outputs a control signal to the motor 721 to rotate the timing belt 723 to shift the positions of respective mounting tables 724 one by one. Incidentally, although the fixing interval of the mounting tables 724 on the timing belt 723 is not described considering limitations of space and so forth in FIG. 27, it is actually designed in such a manner that the moving distance of the mounting table 724 from the lower tier (the upper tier) to the upper tier (the lower tier) and the moving distance of the mounting table 724 on the same tier are the same.

Figure 29:
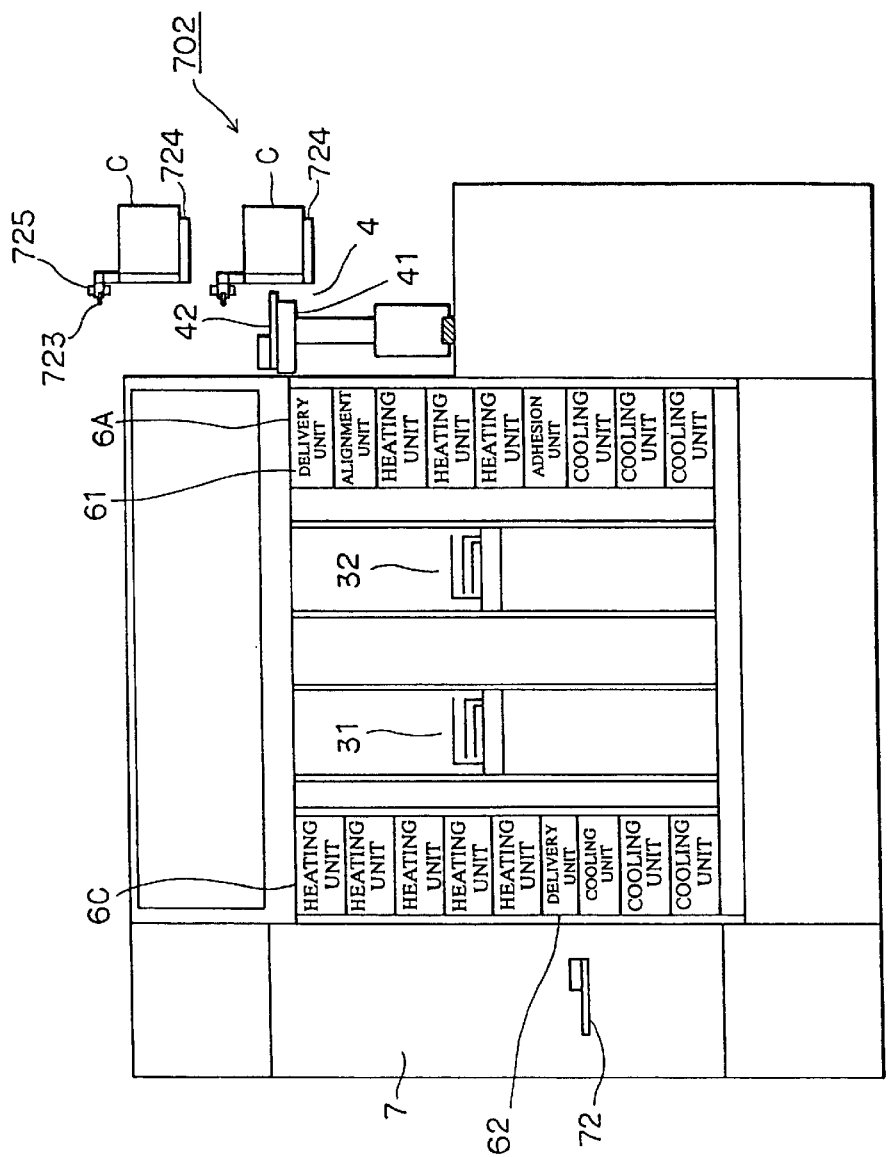
FIG. 29 is a sectional view of the coating and developing system according to the ninth embodiment of the present invention.

The processing section 3 includes the two main transfer arms 31 and 32 at the center thereof, and the shelves 6A, 6B and 6C are respectively provided in front of, behind, and on the left side of the main transfer arms 31 and 32. The shelves 6A to 6C are each composed of a plurality of units piled on top of one another. As shown in FIG. 29, these units are allocated for a heating unit for heating a wafer, a cooling unit for cooling the wafer, a hydrophobic processing unit for making the surface of the wafer hydrophobic, an alignment unit for aligning the wafer, and the like. Further, in each of the shelves 6A and 6C, one unit of a unit group is allocated for a delivery unit of the wafer. In FIG. 29. numerals 61 and 62 represent deliver units. It should be noted that the allocation of the units shown in FIG. 29 is performed for convenience to give an image, and that the arrangement of the units is not restricted to the above one.

On the right side of the main transfer arms 31 and 32, two of the developing units 33 composing a developing processing section are provided on the upper tier side and two of the coating units 34 composing a coating processing section on the lower tier side. The main transfer arms 31 and 32 are ascendable and descendable, rotatable around a vertical axis, and movable forward and backward, and assigned to deliver the wafer W between the respective units of the shelves 6A to 6C, the coating units 34, and the developing units 33. Incidentally, the delivery of the wafer W between the main transfer arms 31 and 32 is performed via the ascendable and descendable intermediate stage 30.

The coating and developing system 100 includes the interface section 7, and the processing section 3 is connected to the aligner 200 (See FIG. 1.) with the interface section 7 between them. The interface section 7 is used for preventing the wafer W from staying due to difference in processing speed between the coating and developing system 100 and the aligner 200, and includes the transfer arm 72 for transferring the wafer W between the delivery unit 62, the inlet/outlet port of the aligner 200, and the buffer carrier 71.

Next, the operation of the aforesaid embodiment will be described with reference to FIG. 30, where, for example, six carriers (to which symbols "A" to "F" are given for convenience of explanation) A to F are respectively mounted on the six carrier mounting tables 724. As for the carrier F, it is assumed that all the wafers W complete processing and are returned into the carrier F.

The carrier F is moved, for example, to the upper tier side which is a first position of the carrier transfer section to be stopped by the drive mechanism 720. The hanging member 752 (referred to as "a first hanging member 752A" for distinction hereinafter) of the carrier transfer mechanism 5 is moved to a position above the carrier F while not hanging a carrier. At this time, the hanging member 752 (referred to as "a second hanging member 752B") holding a carrier (to which a symbol "G" is given) G housing the unprocessed wafers W is moved after the first vacant hanging member 752A (See FIG. 30 (a)).

Figure 30:
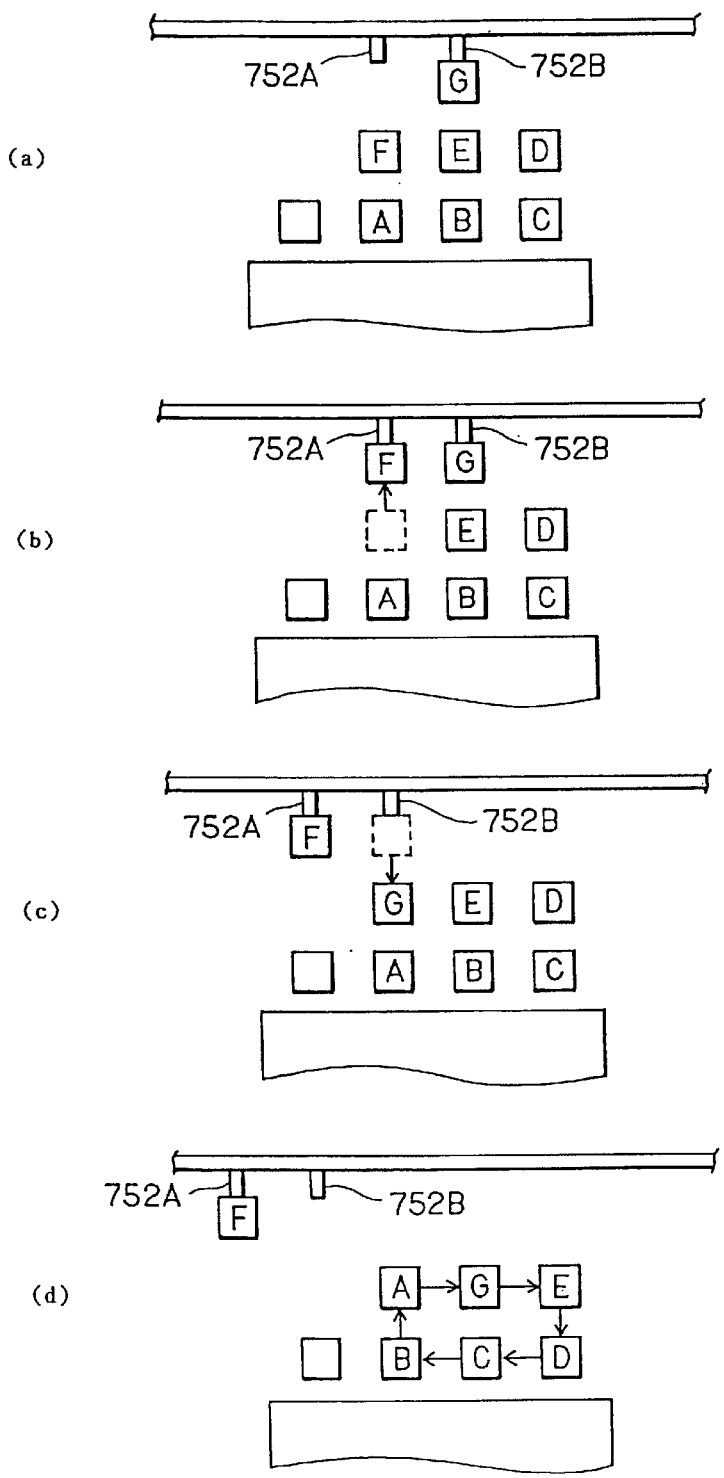

After hanging the processed carrier F (See FIG. 30 (b)), the first hanging member 752A moves so that the carrier G hung by the second hanging member 752B is located at the position where the carrier F was located before (See FIG. 30(b)). Thereafter, the carrier G is mounted on the carrier mounting table 724 which is emptied by the carrier F being taken away (See FIG. 30(c)).

Meanwhile, the unprocessed wafers W are taken out from the carriers A to C, for example, stopped on the lower tier side which is a second position of the container mounting unit 730 and delivered to the delivery unit 61 of the processing section 3 (See FIG. 2.) by the wafer transfer mechanism 4.

As for the carriers A and B, the wafers W start to be taken out in a state prior to the state in FIG. 30 (a), that is, the state in which the carriers F, A, and B are arranged from the left side in order at the lower tier. While the wafers W taken out are processed, the positions of the carriers A and B are shifted to the left side as shown in FIG. 30(a). Thus, the control section 40 writes the positions of carriers as well as the processing conditions of each wafer W, grasps in which position a carrier is located when a processed wafer is returned to the carrier by reading the data in a memory, and controls the wafer transfer mechanism 4 so that the wafer can be delivered to the carrier.

When processing for all the wafers W in the carrier A is completed and all the wafers W are returned into the carrier A, the drive mechanism 20 is driven in accordance with a control signal from the control section 40, the carrier A is moved to the first position of the container mounting unit 730, and concurrently the other carriers B to E, and G are respectively moved to the next position one by one (See FIG. 30(*d*)). While processing for the carriers A to C is performed, the carrier F which is previously taken away is transferred to the following processing station or the stocker by the carrier transfer mechanism 5.

According to the aforesaid embodiment, the carrier transfer mechanism 5 which corresponds to the conventional automatic transfer robot travels a high place away from the floor. Consequently, the occupation space of the apparatus for the whole system including the carrier transfer mechanism 5 can be reduced, and the area of the floor hitherto used for a traveling path of the automatic transfer robot can be utilized for an installation space of the apparatus, for example, thus enabling an efficient layout in an expensive clean room. In this case, if the carrier mounting tables 724 are set side by side in a vertical placement and the carrier transfer mechanism 5 gets access to the substrate carrier C on the upper tier side, there arises an advantage that the carrier transfer mechanism 5 can be provided in a high location and a stroke thereof in access can be reduced.

Concerning the carrier transfer mechanism, it is possible that the carrier mounting tables 724 circularly move in a horizontal plane in the carrier transfer section 2, and that the access to the carrier C or the wafer W is performed while the carrier mounting tables 724 are stopped not in vertical placement but in a placement of one behind the other. The transfer of the carrier C between the carrier transfer mechanism 5 and the carrier transfer section 2 may be performed by an operator.

Next, a tenth embodiment of the present invention will be explained.

Figure 31:
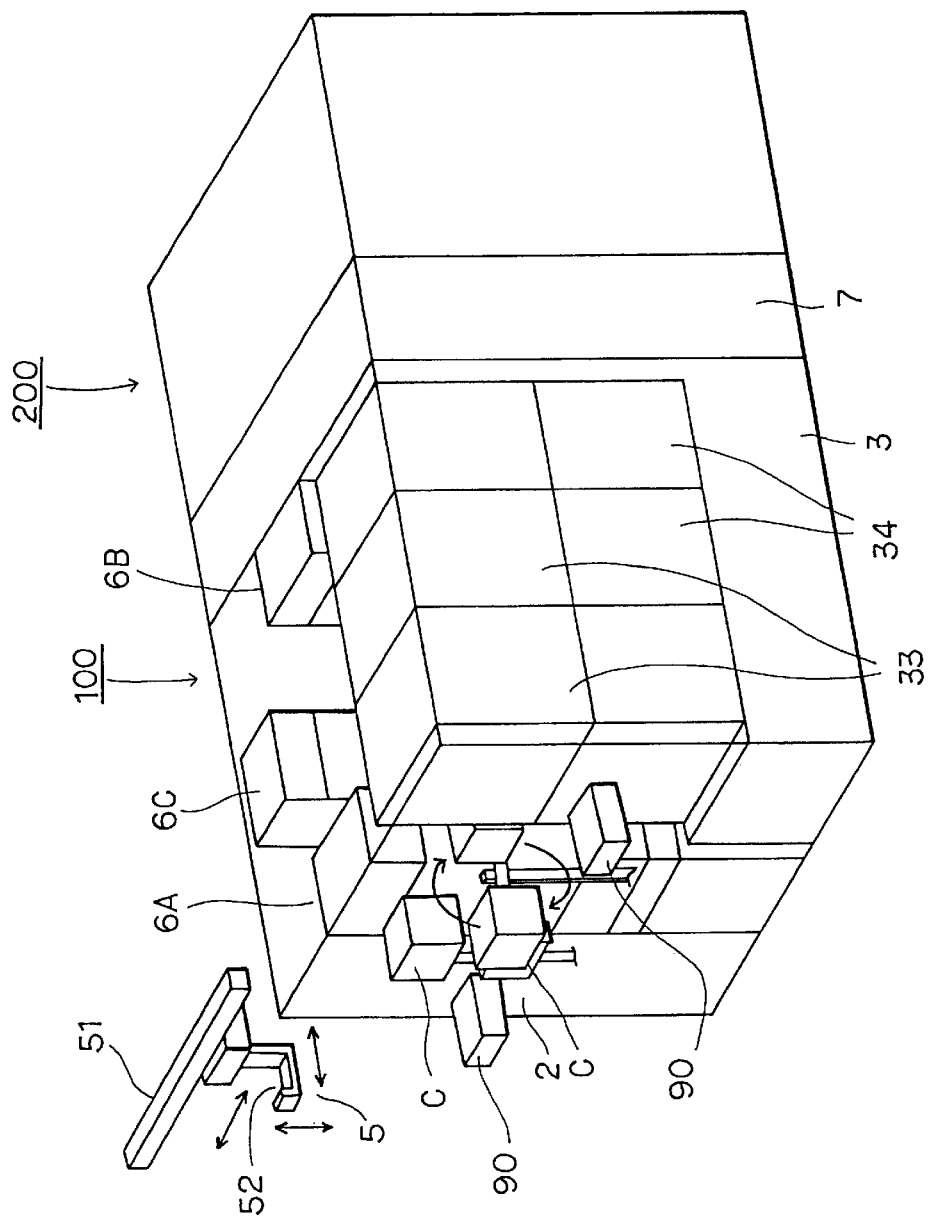
FIG. 31 is a perspective view of a substrate processing apparatus according to a tenth embodiment of the present invention.

FIG. 31 is a perspective view of the coating and developing system 100 provided with an area sensor 90 in the vicinity of the carrier transfer section 2 according to this embodiment. An apparatus in this embodiment has a structure in which the area sensor 90 is attached to the apparatus described in the first embodiment. It should be noted that the explanation of the same structure as in the first embodiment is omitted.

When an object other than machines related to the substrate processing apparatus, for example, a person or the like enters the area where the substrate carriers C move while the apparatus is in operation, the area sensor 90 senses the presence of the entering object. When the area sensor 90 senses the entering object, the operation of the substrate carriers C is stopped, thus preventing troubles due to contact. Thereby, breakage of wafers mounted on the substrate carriers C and the like is prevented. Moreover, if the entering object is a person, for instance, the occurrence of an injury is prevented.

As described above, the attachment of the area sensor 90 to the apparatus enables the prevention of troubles due to contact while the apparatus is in operation, thus obtaining the substrate processing apparatus with excellent safety.

Figure 32:
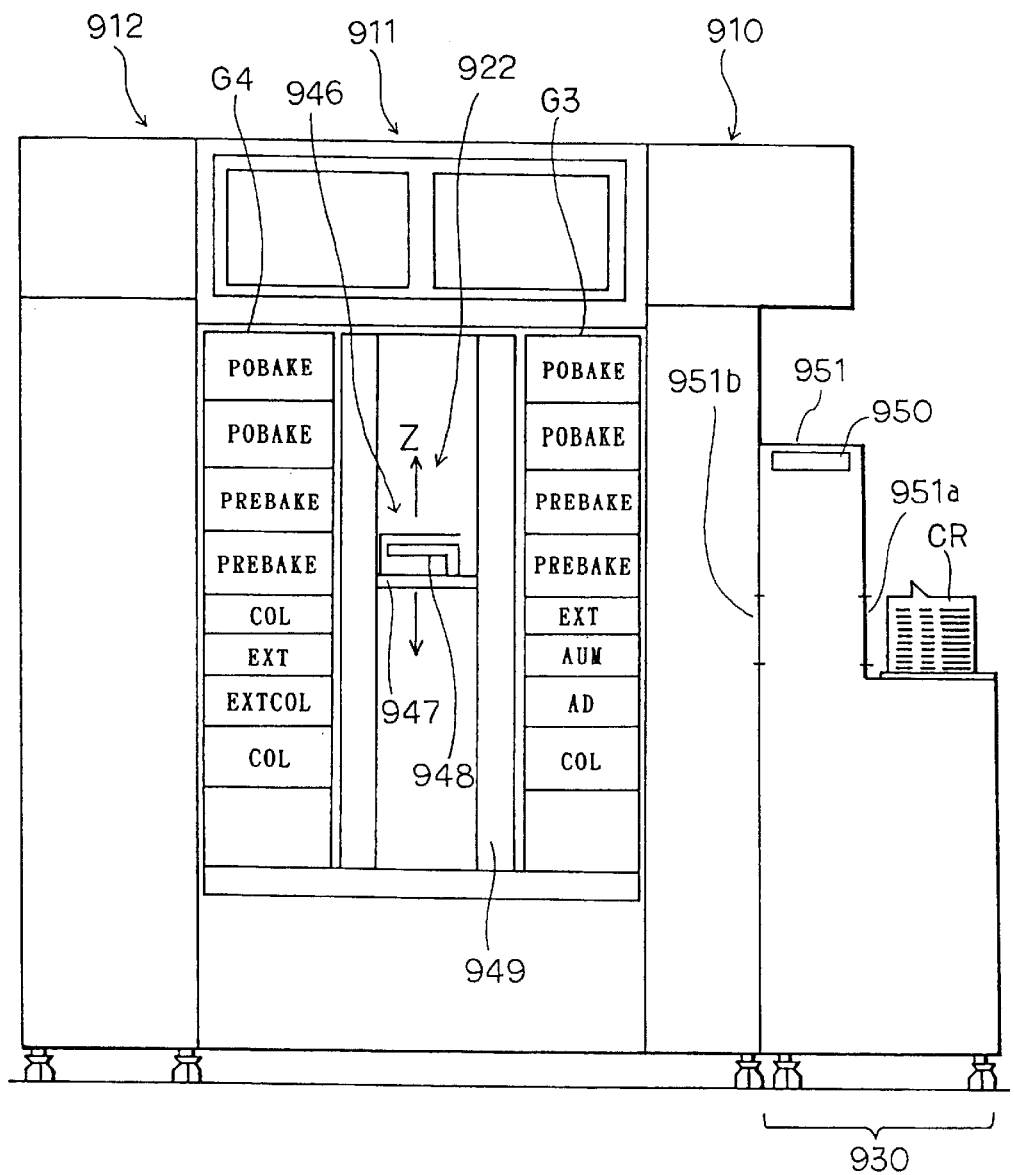
FIG. 32 is a rear view of a coating and developing system according to the tenth embodiment of the present invention.
Figure 33:
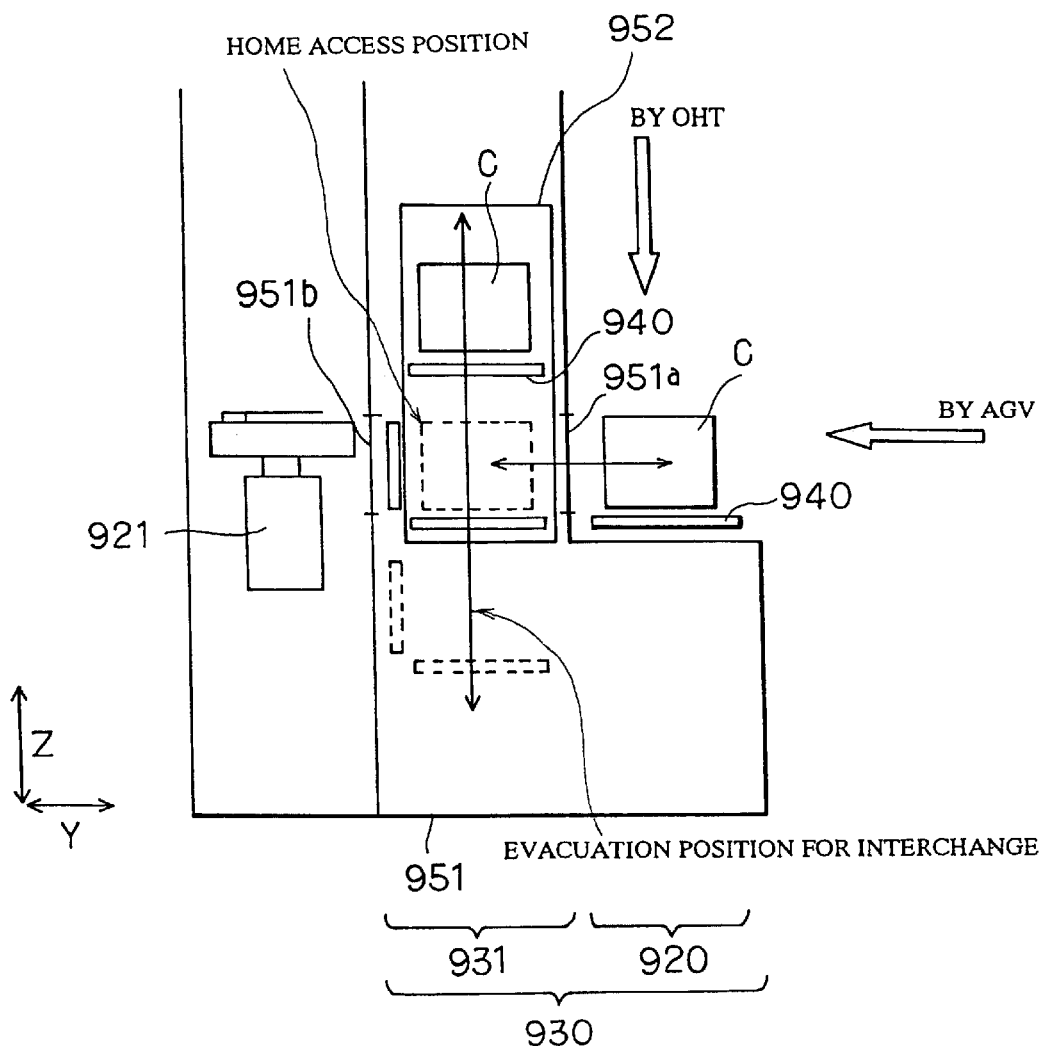
FIG. 33 is a view related to the tenth embodiment, showing a state in which the position of a substrate carrier is shifted.
Figure 34:
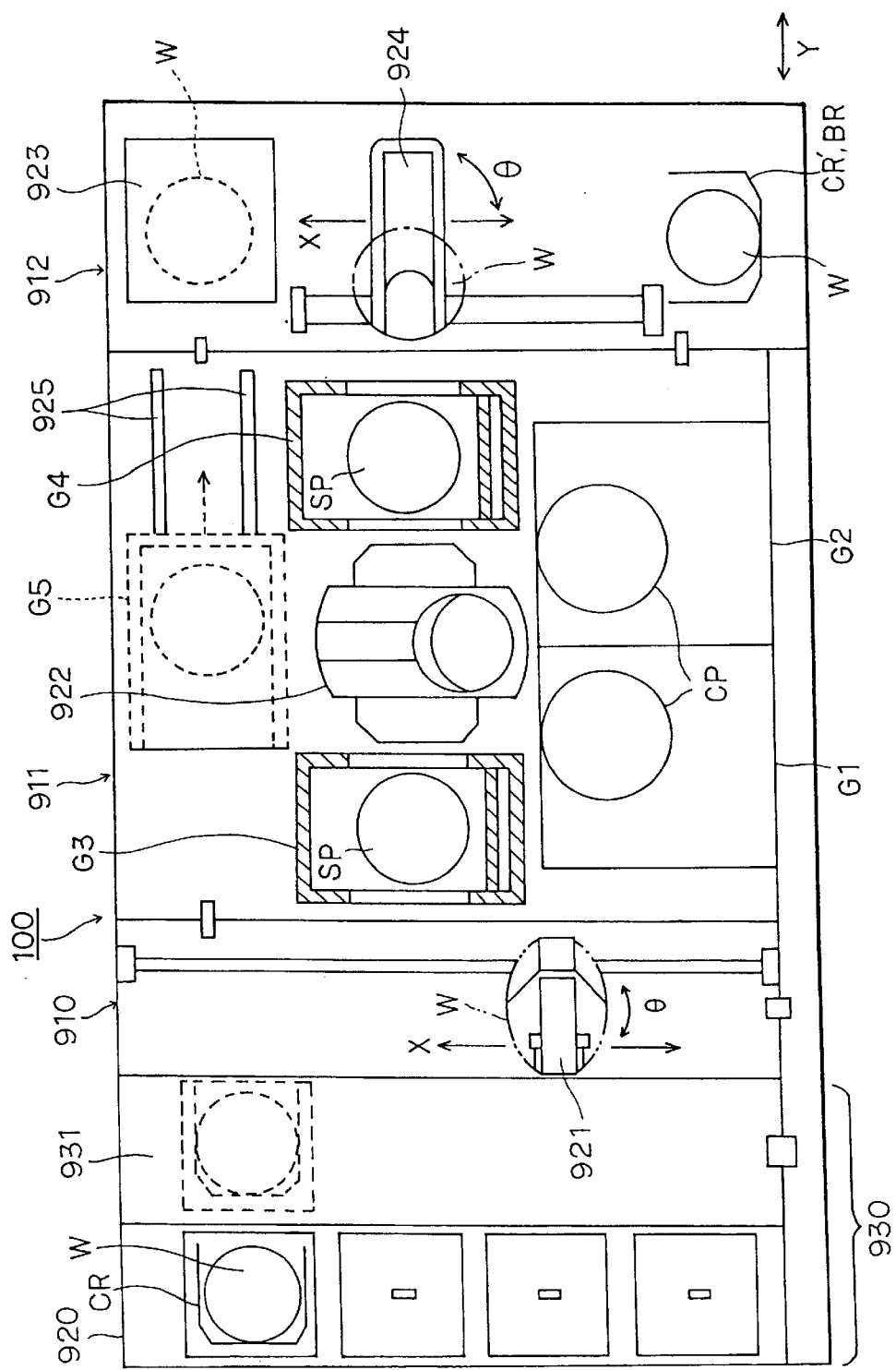
FIG. 34 is a plane view of the coating and developing system according to the tenth embodiment of the present invention.

Next, an eleventh embodiment of the present invention will be explained with reference to FIG. 32 to FIG. 34. Incidentally, this embodiment has a structure in which cooling means is provided in the container mounting unit of the apparatus in the third embodiment. It should be noted that the explanation of the same structure as in the third embodiment is partially omitted. FIG. 32 is a rear view of the coating and developing system. FIG. 33 is an enlarged view of a part of a substrate carrier mounting unit 930 in FIG. 32. FIG. 34 is a plane view of the coating and developing system.

As shown in FIG. 32 and FIG. 33, provided in the substrate carrier mounting unit 930 according to this embodiment are a substrate carrier mounting section 920 as a first position and a waiting space 931 as a third position, disposed between the substrate carrier mounting section 920 and an auxiliary arm 921 as a substrate transfer mechanism, for waiting the substrate carrier C. A container 952 as a second position is provided in the waiting space 931. The substrate carrier C held in the container 952 is delivered to the auxiliary arm 921. The waiting space 931 is located in a closed container 951 shut off from the outside and the auxiliary arm 921. The delivery of wafers between the waiting space 931 and the substrate carrier mounting section 920 is performed through a door 951*a* which is provided in the closed container and can open and shut. Moreover, the delivery of wafers between the waiting space 931 and the auxiliary arm 921 is performed through a door 951*b* which is provided in the closed container and can open and shut. The closed container 951 has the structure that N2 gas is supplied thereinto from inert gas supplying means not shown and that the inside thereof is cooled at a temperature of 23° C. by a cooling device 950 which is cooling means provided at the top of the closed container 951.

The rectangular parallelepiped-shaped container 952 is disposed to be ascendable and descendable. The container 952 is divided into two rooms by a partition plate (not shown) provided in the middle of the container 952 in the vertical direction. Each room can accommodate one substrate carrier C, so that the container 952 can accommodate up to two substrate carriers C. A linear drive motor L (L1) for moving the substrate carrier C lineally in the Y-direction is provided in the substrate carrier mounting section 920 to take the substrate carrier C and a holding member 940 thereunder in and out between the substrate carrier mounting section 920 and the container 952.

Next, the procedure for moving the position of the substrate carrier C in the case of processing by use of the substrate processing apparatus according to this embodiment will be explained.

In the processing apparatus according to this embodiment, the substrate carrier C housing the unprocessed wafers W is mounted on the substrate carrier mounting section 920 by means of the external transfer device such as the automatic transfer robot (AGV).

In this situation, the container 952 is set in the lower position in the waiting space 931, and a substrate carrier on the upper side of the container 952 is maintained at the same height as the substrate carrier mounting section 920.

Thereafter, when the door 951*a* of the closed container opens, the substrate carrier C is moved together with the holding member 940 thereunder in the left direction in FIG. 33 and accommodated in a substrate carrier on the upper side of the container 952. After the substrate carrier C is accommodated, the door 951*a* of the closed container is shut. The inside of the closed container 951 is previously cooled at a temperature of 23° C. by the cooling device 950. In addition, N2 gas is supplied into the closed container 951 by the inert gas supplying means not shown.

Thus, the substrate carrier C accommodated in the upper substrate carrier of the container 952 is transferred to a home access position which is a position between the substrate carrier mounting section 920 and the auxiliary arm 921.

When the substrate carrier C is set in the home access position, the door 951b of the closed container is opened. Subsequently, the auxiliary arm 921 moves to an opening on the left side of FIG. 33 of the substrate carrier C, gets an arm portion at its forward end into the substrate carrier C, and takes out the unprocessed wafer W housed therein. Then, the door 951a of the closed container is shut.

As shown in FIG. 34, the auxiliary arm 921 moves while holding the unprocessed wafer W taken out and delivers it to a delivery section of the third unit group $G_3$ on a processing section 911 side.

Thereafter, the main arm 922 takes the unprocessed wafer W out of the delivery section, moves, and sets it in a cooling unit (COL) of the third unit group $G_3$. The wafer W then undergoes cooling processing at a temperature of 23° C. In this situation, the wafer W is previously given cooling processing in the substrate carrier mounting unit 930, which can reduce the time spent before the wafer W reaches a predetermined temperature.

The main arm 922 then receives the wafer W from the cooling unit (COL) and delivers it to a cup (CP) in the first unit group, and the wafer W undergoes resist coating processing.

Is this embodiment, the cooling means is provided in the substrate carrier mounting unit as described above, thereby enabling a reduction in cooling process time before resist coating.

Next, a twelfth embodiment of the present invention will be explained with reference to FIG. 35 and FIG. 36. It should be noted that this embodiment has a structure in which a part of the cooling unit (COL) is removed from the processing section in the apparatus of the eleventh embodiment, and in which doors 932 which can open and shut are provided so that the wafer W can be transferred between the auxiliary arm 921 and the first unit group. Incidentally, the explanation of the same structure as in the eleventh embodiment is partially omitted.

Figure 35:
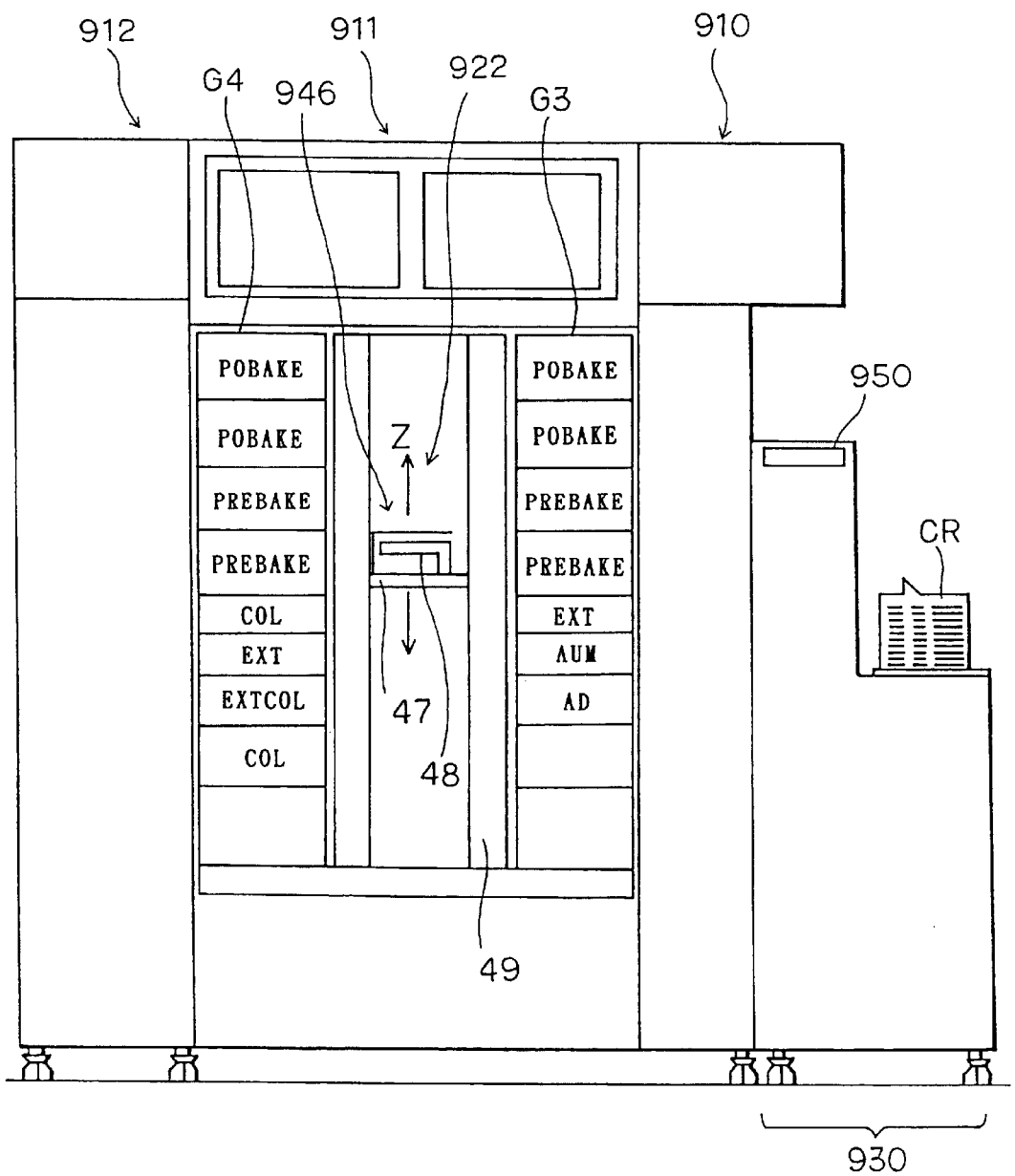
FIG. 35 is a rear view of a coating and developing system according to an eleventh embodiment of the present invention.
Figure 36:
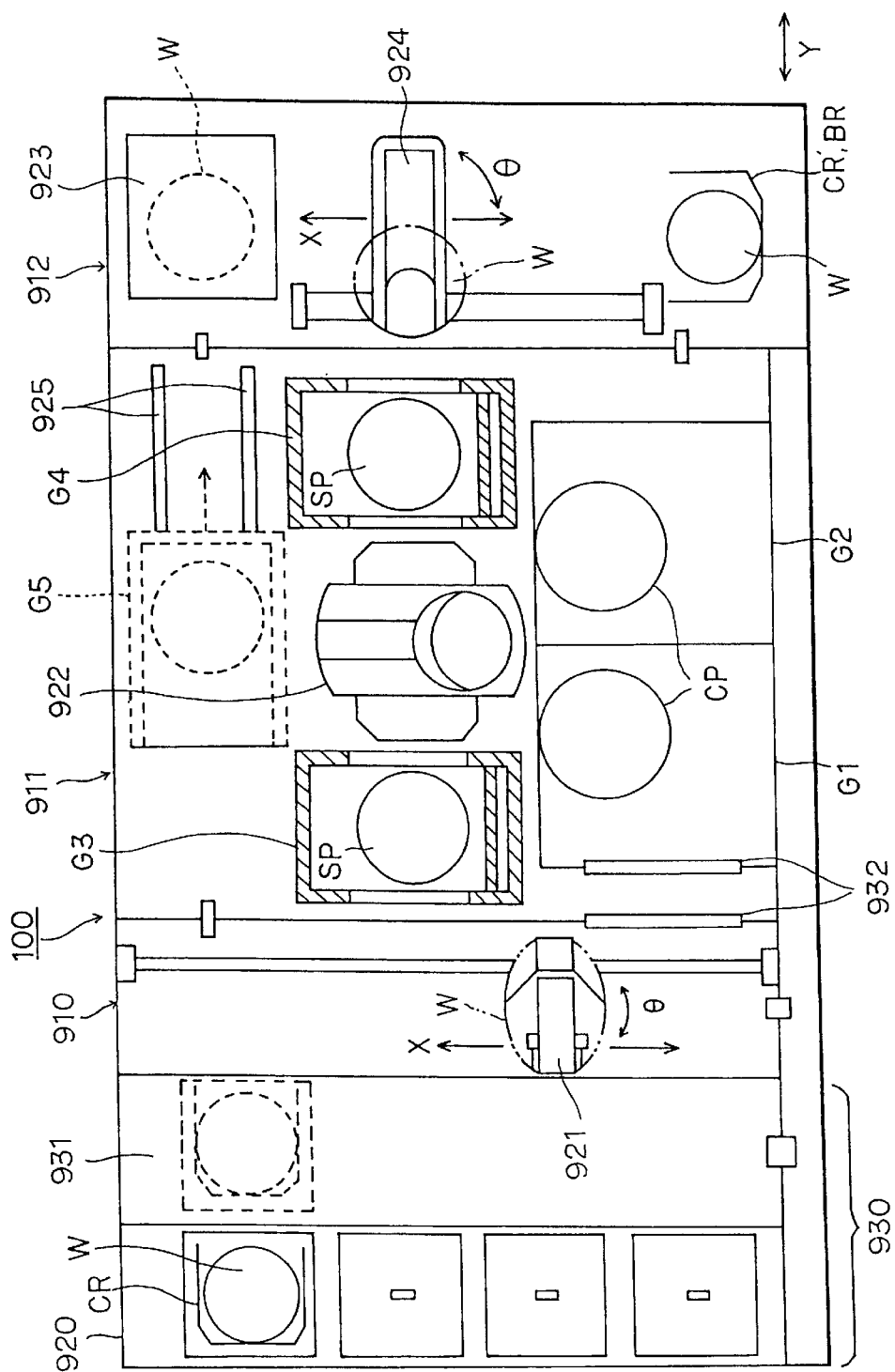
FIG. 36 is a plane view of the coating and developing system according to the eleventh embodiment of the present invention.

In this embodiment, as shown in FIG. 35, cooling by the cooling device 950 mounted in the substrate carrier mounting unit 930 as a substrate carrier mounting section also serves for cooling of wafers before the resist coating process, whereby a part of the cooling unit (COL) can be removed. Hitherto, after transferred from the substrate carrier mounting unit 930, the wafer W is moved to the delivery section of the third unit group $G_3$, the cooling unit, and then the first unit group $G_1$ where the resist coating processing is performed. Meanwhile, in this embodiment, the wafer W transferred from the carrier mounting unit 930 is directly delivered to the cup (CP) in the first unit group $G_1$ through the opened door 932 and immediately coated, thus greatly reducing processing time of the wafer W. In this case, it is desirable to maintain the substrate carrier mounting unit 930 at a cooling temperature of 23° C.

As described above, in this embodiment, the cooling unit for performing the cooling process before the resist coating process, which is needed so far, can be removed, thereby making it possible to decrease the apparatus in size and reduce processing time.

The aforesaid embodiments have the intention of clarifying technical meaning of the present invention. Therefore, the present invention is not intended to be limited to the above concrete embodiments and to be interpreted in a narrow sense, and various changes may be made therein without departing from the spirit of the present invention and within the meaning of the claims. For instance, in the aforesaid embodiments, the present invention is explained with the processing apparatus for the wafers W in manufacturing semiconductor devices as an example. However, the present invention is applicable to any apparatus in which a plurality of substrates are sequentially transferred from the outside and processed. Accordingly, it is needless to say that it is applicable to a processing apparatus for glass substrates for a liquid crystal display.

What is claimed is:

1. A substrate processing apparatus comprising:
   a processing unit that performs a process on a substrate;
   a carrier stage for delivering and receiving a substrate carrier to and from an external carrier conveyer, the carrier stage being configured to support the substrate carrier thereon at a first level with the substrate being horizontally accommodated in the substrate carrier;
   a carrier container having a plurality of shelves arranged in a vertical direction, each of the shelves being adapted to support the substrate carrier thereon while the substrate is horizontally accommodated in the substrate carrier;
   a container elevating mechanism adapted to vertically move the carrier container in order to locate the substrate carrier supported on any one of the shelves at the first level;
   a substrate transfer arm that horizontally removes a substrate, which is to be processed in the processing unit, from the substrate carrier located at the first level in the carrier container, and that horizontally inserts a processed substrate, which has been processed in the processing unit, into the substrate carrier located at the first level in the carrier container; and
   a carrier transfer mechanism adapted to horizontally move the substrate carrier located on one of the shelves at the first level to the carrier stage and vise versa without changing an attitude of the substrate carrier.

2. The substrate processing apparatus according to claim 1, wherein the carrier stage, the carrier container and the substrate transfer arm are arranged such that they are linearly aligned, as viewed in a vertical direction, when the substrate transfer arm accesses the substrate carrier placed in the carrier container.

3. The substrate processing apparatus according to claim 1 further comprising a housing of said processing apparatus surrounding at least the carrier container, wherein the carrier stage is arranged so that when the substrate carrier is placed on the carrier stage, the substrate carrier is located outside the housing.

4. The substrate processing apparatus according to claim 1 wherein the external carrier conveyer is one of an automated guided vehicle and an overhead traveling conveyer.

5. A substrate processing apparatus comprising:
   a processing unit that performs a process on a substrate;
   a plurality of carrier stages each for delivering and receiving a substrate carrier to and from an external carrier conveyer, the carrier stages being arranged in a row in a first horizontal direction, and each of the carrier stages being configured to support the substrate carrier thereon at a first level with the substrate being horizontally accommodated in the substrate carrier;
   a plurality of carrier containers arranged in correspondence to the carrier stages and aligned in a row in the first horizontal direction, each of the carrier containers having a plurality of shelves arranged in a vertical direction, each of the shelves being adapted to support the substrate carrier thereon with the substrate being horizontally accommodated in the substrate carrier, and each of the carrier containers being provided with a container elevating mechanism adapted to vertically move the carrier container in order to locate the substrate carrier supported on any one of the shelves at the first level;

carrier transfer mechanisms each adapted to move, in a second horizontal direction perpendicular to the first horizontal direction, the substrate carrier located on one of the shelves of each of the carrier containers at the first level to the corresponding carrier stage and vise versa without changing an attitude of the substrate carrier; and a substrate transfer arm adapted to move in the first and second horizontal directions to access the substrate carrier located at the first level in each of the carrier containers in order for the substrate transfer arm to horizontally remove the substrate, which is to be processed in the processing unit, from the substrate carrier located at the first level in one of the carrier containers, and to insert a processed substrate, which has been processed in the processing unit, into the substrate carrier located in one of the carrier containers at the first level.

6. The substrate processing apparatus according to claim 5 wherein the external carrier conveyer is one of an automated guided vehicle and an overhead traveling conveyer.

* * * * *